United States Patent
Nerheim et al.

(10) Patent No.: US 10,451,387 B2
(45) Date of Patent: *Oct. 22, 2019

(54) SYSTEMS AND METHODS FOR CALIBRATING A CONDUCTED ELECTRICAL WEAPON

(71) Applicant: Axon Enterprise, Inc., Scottsdale, AZ (US)

(72) Inventors: Magne H. Nerheim, Paradise Valley, AZ (US); Valerie Renee Barry Barber-Axthelm, Seattle, WA (US); Eric Heindel Goodchild, Scottsdale, AZ (US); Siddharth Heroor, Glendale, AZ (US)

(73) Assignee: Axon Enterprise, Inc., Scottsdale, AZ (US)

( * ) Notice: Subject to any disclaimer, the term of this patent is extended or adjusted under 35 U.S.C. 154(b) by 332 days.

This patent is subject to a terminal disclaimer.

(21) Appl. No.: 15/299,286

(22) Filed: Oct. 20, 2016

(65) Prior Publication Data

US 2018/0059146 A1  Mar. 1, 2018

Related U.S. Application Data

(60) Provisional application No. 62/379,165, filed on Aug. 24, 2016.

(51) Int. Cl.
*F41H 13/00* (2006.01)
*G01R 35/00* (2006.01)
(Continued)

(52) U.S. Cl.
CPC ..... *F41H 13/0012* (2013.01); *F41H 13/0025* (2013.01); *G01R 15/16* (2013.01);
(Continued)

(58) Field of Classification Search
CPC ............ F41H 13/0025; F41H 13/0012; G01R 31/3191; G01R 35/005; G01R 35/00
(Continued)

(56) References Cited

U.S. PATENT DOCUMENTS

| 3,983,476 A | 9/1976 | Konopasek |
| 7,602,597 B2 | 10/2009 | Smith |

(Continued)

FOREIGN PATENT DOCUMENTS

| CN | 101201230 A | 6/2008 |
| WO | 2013158413 A1 | 10/2013 |

OTHER PUBLICATIONS

International Searching Authoriy, International Search Report for International Patent Application No. PCT/US16/057986 dated May 16, 2017.

(Continued)

*Primary Examiner* — Amy He
(74) *Attorney, Agent, or Firm* — Lethamm Law Firm

(57) ABSTRACT

Systems and methods for calibrating a conducted electrical weapon ("CEW") to provide a predetermined amount of current for each pulse of the stimulus signal. Providing the predetermined amount of current, close thereto, increases the effectiveness of the stimulus signal in impeding locomotion of a human or animal target. The calibration process enables a CEW to calibrate the amount of charge in a pulse of the stimulus signal in the environmental conditions where the tester operates and also in the field where the environmental conditions may be different from the environmental conditions during calibration.

16 Claims, 12 Drawing Sheets

(51) Int. Cl.
  *G01R 31/319* (2006.01)
  *G01R 31/385* (2019.01)
  *G01R 15/16* (2006.01)
  *G01R 17/02* (2006.01)

(52) U.S. Cl.
  CPC .......... *G01R 15/165* (2013.01); *G01R 17/02* (2013.01); *G01R 31/3191* (2013.01); *G01R 31/385* (2019.01); *G01R 35/00* (2013.01); *G01R 35/005* (2013.01)

(58) Field of Classification Search
  USPC ........................................................ 324/601
  See application file for complete search history.

(56) References Cited

U.S. PATENT DOCUMENTS

| | | |
|---|---|---|
| 8,324,902 B2 | 12/2012 | Burns |
| 8,428,899 B2 | 4/2013 | Miller |
| 8,564,297 B2 | 10/2013 | Burns |
| 9,903,690 B1* | 2/2018 | Nerheim .............. F41H 13/0025 |
| 2005/0188888 A1 | 9/2005 | Watkins, III et al. |
| 2007/0019358 A1 | 1/2007 | Kroll |
| 2008/0130193 A1 | 6/2008 | Nerheim |
| 2010/0134090 A1* | 6/2010 | Burns ................... F41A 17/063 324/72 |
| 2012/0037702 A1 | 2/2012 | Kude |
| 2012/0170168 A1 | 7/2012 | Brundula |
| 2014/0045146 A1 | 2/2014 | Otte |
| 2014/0225630 A1 | 8/2014 | Stethem |
| 2015/0125828 A1 | 5/2015 | Otte |
| 2015/0153144 A1 | 6/2015 | Cheatham, III et al. |
| 2018/0045494 A1* | 2/2018 | Heroor ................ F41H 13/0025 |

OTHER PUBLICATIONS

International Searching Authoriy, Written Opinion of the International Searching Authority for International Patent Application No. PCT/US16/057986 dated May 16, 2017.

Taiwan Patent Office, Taiwan Office Action for Taiwan Patent Application No. 105135991 dated Oct. 30, 2017.

* cited by examiner

SYSTEMS AND METHODS FOR CALIBRATING A CONDUCTED ELECTRICAL WEAPON

FIELD OF THE INVENTION

Embodiments of the present invention relate to calibrating a stimulus signal of a conducted electrical weapon ("CEW") in cooperation with a tester.

BRIEF DESCRIPTION OF THE SEVERAL VIEWS OF THE DRAWING

Embodiments of the present invention will be described with reference to the drawing, wherein like designations denote like elements, and.

DETAILED DESCRIPTION OF INVENTION

Figure 1:
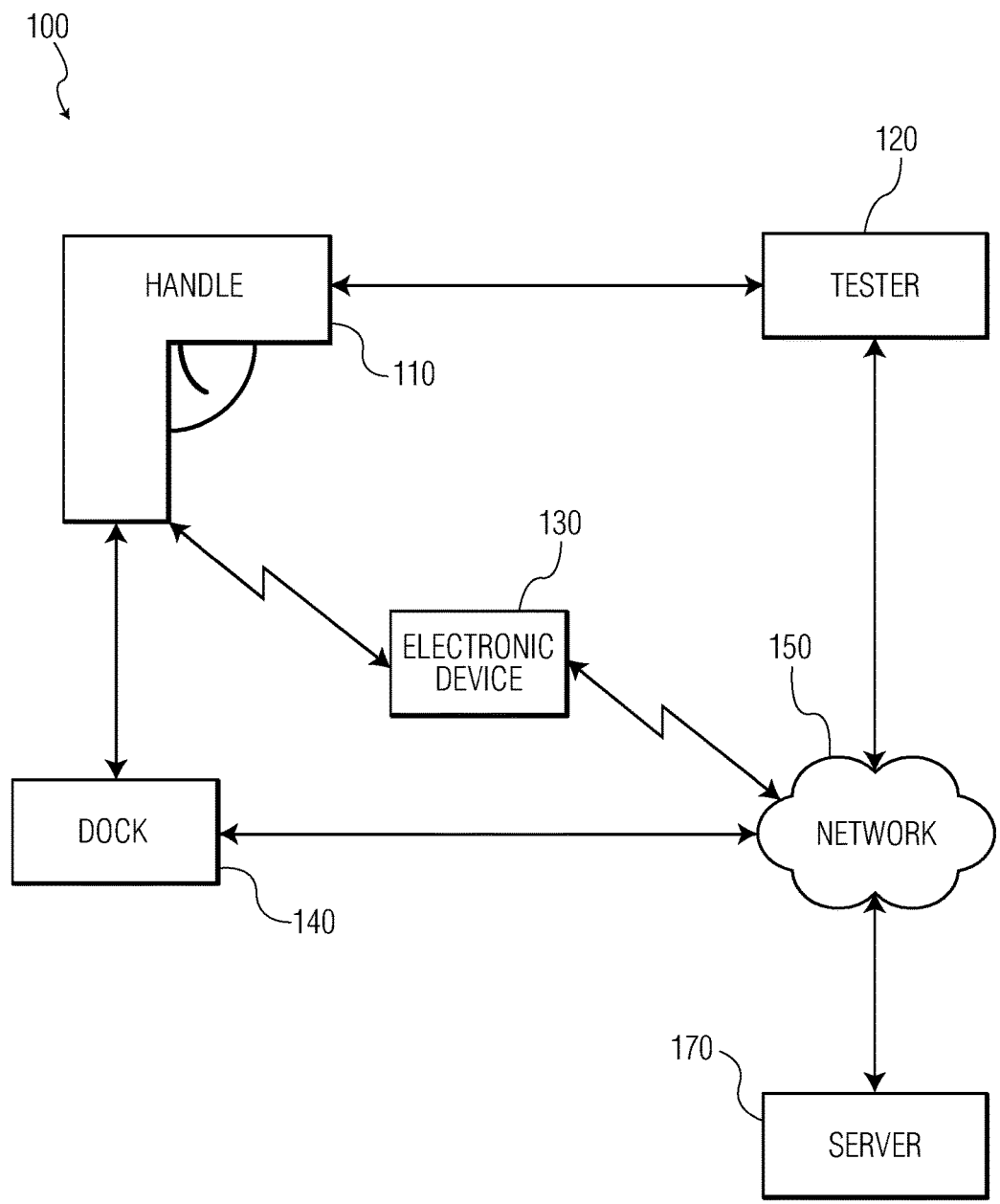
FIG. 1 is a functional block diagram of a system that creates an environment (e.g., ecosystem) for calibrating, transmitting information (e.g., data) related to calibration, and storing information related to calibration according to various aspects of the present invention.

A conducted electrical weapon ("CEW") is a device that provides a stimulus signal through a human or animal target. A stimulus signal inhibits locomotion of the target. Locomotion may be inhibited by interfering with voluntary use of skeletal muscles and/or causing pain in the target. A stimulus signal that interferes with skeletal muscles causes the skeletal muscles to lockup (e.g., freeze, tighten, stiffen) so that the target may not voluntarily move.

A stimulus signal may be more effective at causing skeletal muscle to lock up if a minimum amount of charge is provided by the stimulus signal into target tissue. A stimulus signal may include a series of pulses. Each pulse of the stimulus signal provides an amount of charge through the target. The pulses are delivered at a pulse rate. Providing a predetermined amount of charge or about the same as (e.g., close to) a predetermined amount of charge per pulse may improve the effectiveness of the stimulus signal in impeding the locomotion of the target. Providing the predetermined amount of charge, or close thereto, by each pulse of the stimulus signal may increase the likelihood of locking up the skeletal muscle of the target to impede locomotion of the target.

A pulse of a stimulus signal may be referred to as a pulse of current.

A CEW may require periodic calibration to increase the likelihood that the CEW provides the predetermined amount of charge per pulse. A CEW may cooperate with a tester to calibrate (e.g., measure, adjust, standardize) the amount of charge provided by a pulse of a stimulus signal. A CEW may measure the amount of charge delivered by each pulse of a stimulus signal independent of a tester. A CEW may adjust (e.g., change, increase, decrease) the charge delivered by one or more pulses of a stimulus signal.

During calibration, a CEW may produce a single pulse of the stimulus signal. The CEW measures a voltage that represents the amount of charge (e.g., coulombs) provided by the single pulse. The tester receives the single pulse of the stimulus signal and measures the amount of charge provided by the pulse. The tester may present (e.g., provide) different loads (e.g., impedance, resistance) to the CEW into which the pulse is delivered. The tester reports the amount of charge that it measured for the pulse to the CEW. Because the tester is periodically calibrated using accurate measurement instruments, the amount of charge as measured by the tester is used by the CEW to determine whether the circuits of the CEW are delivering a predetermined amount of charge with each pulse. A CEW may receive a message from the tester regarding the amount of charge measured by the tester for a pulse of the stimulus signal to determine whether its circuits are providing the predetermined amount of charge.

A CEW may include a handle and one or more deployment units (e.g., cartridges). Deployment units removeably insert into the handle. A deployment unit includes one or more wire-tethered electrodes that are launched by a propellant toward a target to provide the stimulus signal through the target. A signal generator (e.g., stimulus generator) in the handle generates the stimulus signal for delivery through the target via the launched electrodes. The cooperation of a handle and one or more deployment units is more fully disclosed in U.S. patent application Ser. No. 15/259,913 filed Sep. 8, 2016 and is herein incorporated by reference for all purposes.

A CEW may operate in an ecosystem to communicate with other electronic devices. For example, ecosystem 100, shown in FIG. 1, may include handle 110, tester 120, electronic device 130, dock 140, network 150, and server 170. Ecosystem 100 enables handle 110 to cooperate with tester 120 for calibrating handle 110. The ecosystem enables handle 110 or the power supply (e.g., battery module, power magazine) of handle 110 to cooperate with dock 140 to transfer data from handle 110 to server 170 via dock 140 and network 150. Ecosystem 100 further enables handle 110 to communicate with electronic device (e.g., smart phone, tablet, computer) 130. One or more deployment units (not shown) may be coupled to handle 110 while handle 110 interacts with electronic device 130. Preferably, the one or more deployment units are removed from handle 110 while handle 110 interacts with tester 120.

Ecosystem 100 enables tester 120 to transfer data to server 170 via network 150. Tester 120 may transfer data that originates with (e.g., is generated by) tester 120. Tester 120 may transfer data that it receives from any source including handle 110. Data originated by tester 120 includes all measurements made by tester 120, all data recorded while tester 120 is calibrated or its operation verified, and all information provided to tester 120 by an operator. Data that is originated by tester 120 may also or exclusive be transferred to server 170 via handle 110, electronic device 130 or dock 140, and network 150.

In an implementation, handle 110 transfers data to a battery pack (not shown) inserted into the handle. The battery pack provides energy to handle 110 to perform the operations of handle 110. The battery pack has electronic circuits for receiving data from handle 110. When the battery pack is separated from handle 110, battery pack retains the data that it received from handle 110. When the battery pack is coupled to dock 140 to recharge the battery, the battery pack transfers the data from handle 110 to dock 140. A battery pack may further include a wireless communication circuit for transmitting the data from handle 110 to dock 140 when the battery pack is within range of dock 140. The battery pack may transfer the data while being recharged.

A handle cooperates with one or more deployment units to provide a stimulus signal through a target. A handle controls, at least in part, the generation of the stimulus signal, launching the electrodes from a deployment unit, communicating with other devices in the ecosystem, receiving instructions from a user, detecting physical quantities (e.g., charge per pulse), and storing information.

A network enables electronic devices to exchange data (e.g., information). A network may include nodes. A communication link (e.g., data link) permits the transfer of information between nodes of the network. A communication link may include a wired or wireless connection. A node of a network may include a server. A server may provide and/or receive data via other nodes and communication links of the network.

An electronic device may send or receives data. An electronic device may be a node in a network. An electronic device may be stationary or portable. An electronic device may present information on a display of the electronic device. An electronic device may receive information from a user via a user interface. An electronic device may perform calculations and/or analyze data. An electronic device may perform a calculation and/or analyze data and provide (e.g., transmit) the result to another device. An electronic device may communicate with other devices via a wired or wireless connection. An electronic device may include a smart phone carried by a user. An electronic device may include a tablet device, a portable computer, and/or a mobile data terminal in a vehicle. An electronic device may operate as an intermediary between a CEW and a node of the network, such as a server.

A tester cooperates with a handle to calibrate the amount of charge provided by a pulse of a stimulus signal as discussed above and herein.

An understanding of how a handle cooperates with a tester to calibrate the charge provided by a pulse of a stimulus signal and how a handle communicates with other devices in ecosystem 100 may be explained by discussing non-limiting implementations of handle 110 and tester 120.

Figure 2:
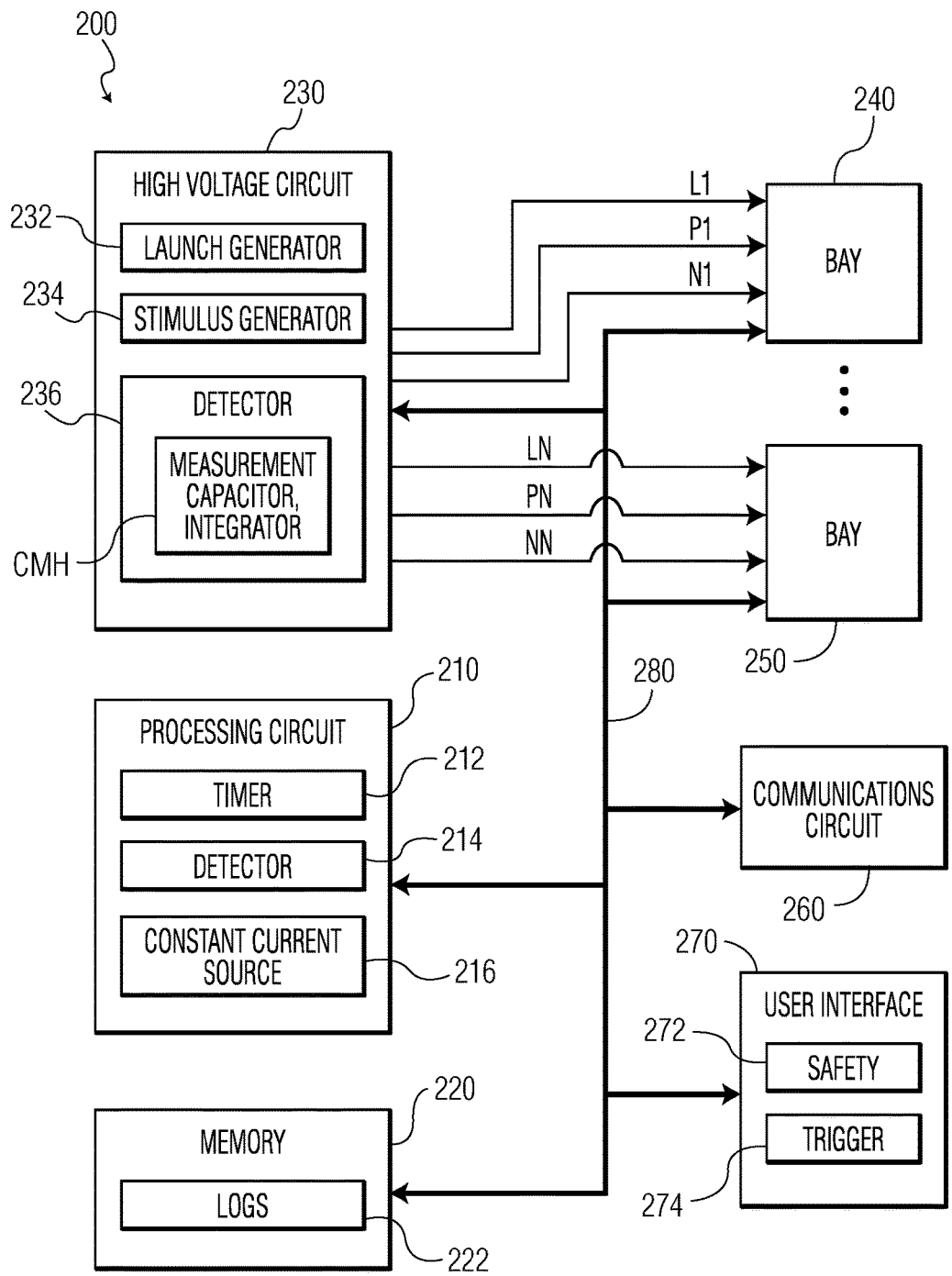
FIG. 2 is a functional block diagram of an implementation of the CEW of FIG. 1.

Handle 200 of FIG. 2 is an implementation of handle 110. Handle 200 performs the functions of a handle and/or handle 110 discussed above and herein. Handle 200 includes processing circuit 210, memory 220, high voltage circuit 230, bay 240, bay 250, communication circuit 260, and user interface 270. Processing circuit 210 includes timer 212, detector 214, current source 216. High voltage circuit 230 includes launch generator 232, stimulus generator 234, detector 236. High voltage circuit 230 may provide electrical signals via conductors L1, P1, N1 to bay 240 and LN, PN, and NN to bay 250. Electrical signals (e.g. L1, P1, N1, LN, PN, NN) may be differential or referenced to a common ground. Detector 236 may include measurement capacitor CMH. User interface 270 may include safety 272 and trigger 274. Memory 220 may include logs 222. Processing circuit 210 may communicate with and/or control high voltage circuit 230, memory 220, bay 240, bay 250, communication circuit 260, and user interface 270 via bus 280. Bus 280 may include any conventional data and/or control bus.

A processing circuit includes any circuitry and/or electrical/electronic subsystem for performing a function. A processing circuit may include circuitry that performs (e.g., executes) a stored program. A processing circuit may include a digital signal processor, a microcontroller, a microprocessor, an application specific integrated circuit, a programmable logic device, logic circuitry, state machines, MEMS devices, signal conditioning circuitry, communication circuitry, a conventional computer (e.g., server), a conventional radio, a network appliance, data busses, address busses, and/or a combination thereof in any quantity suitable for performing a function and/or executing one or more stored programs.

A processing circuit may further include conventional passive electronic devices (e.g., resistors, capacitors, inductors) and/or active electronic devices (op amps, comparators, analog-to-digital converters, digital-to-analog converters, current sources, programmable logic). A processing circuit may include conventional data buses, output ports, input ports, timers, memory, and arithmetic units.

A processing circuit may provide and/or receive electrical signals whether digital and/or analog in form. A processing circuit may provide and/or receive digital information (e.g., data) via a conventional bus using any conventional protocol. A processing circuit may receive information, manipulate the received information, and provide the manipulated information. A processing circuit may store information and retrieve stored information. Information received, stored, and/or manipulated by the processing circuit may be used to perform a function and/or to perform a stored program.

A processing circuit may control the operation and/or function of other circuits and/or components of a system. A processing circuit may receive status information regarding the operation of other components, perform calculations with respect to the status information, and provide commands (e.g., instructions) to one or more other components, for example, for the component to start operation, continue operation, alter operation, suspend operation, or cease operation. Commands and/or status may be communicated between a processing circuit and other circuits and/or components via any type of bus including any type of conventional data/address bus.

A memory stores information. A memory provides previously stored information. A memory may provide previously stored information responsive to a request for information. A memory may store information in any conventional format. A memory may store electronic digital information. A memory may store information organized in a data structure and/or database.

A memory includes any semiconductor, magnetic, optical technology, or any combination thereof for storing information. A memory may receive information from a processing circuit for storage. A processing circuit may provide a memory a request for previously stored information. Responsive to the request the memory may provide stored information to a processing circuit. A memory includes a collection (e.g., group, system) of memories that cooperate to store and/or retrieve information.

A memory includes any digital circuitry for storing program instructions and/or data. Storage may be organized in any conventional manner (e.g., program code, buffer, circular buffer, data structure). Memory may be incorporated in and/or accessible by a transmitter, a receiver, a transceiver, a sensor, a controller, and a processing circuit.

A high voltage circuit of a CEW may provide a voltage, in the range of 500 to 100,000 volts. The high voltage circuit may be coupled to the wire-tethered electrodes to allow delivery of a high voltage to a human or animal target. A pulse of a stimulus signal may include an ionization portion and a lower voltage portion. The magnitude of the voltage of the ionization portion is between 50,000 and 100,000 volts. The ionization voltage may ionize air in a gap between the electrodes and the target. Ionizing air in a gap establishes a low impedance ionization path between the high voltage circuit and the target for delivering a current through target tissue. A high voltage in the range of about 50,000 volts can ionize air in a gap of up to about one inch.

After ionization, the ionization path persists (e.g., remain in existence) as long as a current is provided via the ionization path. After ionization, the high voltage circuit provides a current at a lower voltage for impeding locomotion of the target by causing pain or muscle lock up. This current may be referred to as the muscle voltage. The magnitude of the voltage of the muscle portion of the stimulus pulse is between 500 and 10,000 volts. When the current provided at the lower voltage ceases or is reduced below a threshold, the stimulus signal ends, the ionization path collapses (e.g., ceases to exist), and the electrode is no longer electrically coupled to the target.

A stimulus generator generates (e.g., provides) the stimulus signal. As discuss herein, a stimulus signal includes a series of pulses of current. A stimulus generator may generator one pulse of the stimulus signal. After each pulse of the stimulus signal, the stimulus generator may adjust its circuitry prior to providing a next pulse of the stimulus signal. Adjustments may include charging a capacitance to a voltage, enabling a switch, and disabling a switch. A processing circuit may control in whole or in part the operation of a stimulus generator. A processing circuit may perform all or part of the operations of a stimulus generator. A stimulus generator may also be referred to as a signal generator.

A bay is a receptacle (e.g., chamber) in a handle of a CEW that accepts (e.g., receives) a deployment unit (e.g., cartridges). A deployment unit may be removeably inserted (e.g., positioned, placed) in a bay. A handle may include one or more bays that receive a respective deployment unit. A deployment unit may contain a filament (e.g. wire, tether), one or more electrodes, a pyrotechnic (e.g. propulsion) for launching the electrodes to deliver a current through a target.

For example, a deployment unit (not shown) may be removeably inserted into bay 240 or bay 250 respectively to launch electrodes toward target to provide a current from high voltage circuit 230 through the target. Launch generator 232 of high voltage circuit 230 may provide an electrical signal for launching the electrodes from a deployment unit. Stimulus generator 234 may provide the stimulus signal. During calibration, deployment units are removed from all bays of the handle and bay inserts (e.g., couplers, connectors) from the tester, discussed below, are inserted into the bays of the handle. The inserts remain in the bays during testing.

A communication circuit may transmit and/or receive information (e.g., data). A communication circuit may transmit and/or receive (e.g., communicate) information via a wireless link and/or a wired connection. A communication circuit may communicate using wireless (e.g., radio, light, sound, vibrations) and/or wired (e.g., electrical, optical) mediums. A communication circuit may communicate using any wireless (e.g., Bluetooth, Bluetooth low energy, Zigbee, WAP, WiFi, NFC, IrDA) and/or any wired (e.g., USB, RS-232, CAN, Firewire, Ethernet, UART, I2C) communication protocols.

A communication circuit may receive information from a processing circuit for transmission. A communication circuit may provide received information to a processing circuit.

A communication circuit in one device (e.g., CEW) may communicate with a communication circuit in another device (e.g., smart phone). Communications between two devices may permit the two devices to cooperate in performing a function of either device.

A user interface may include one or more controls (e.g., switch, touch screen, button, trigger, safety switch) that permit a user to interact and/or communicate with a device to control (e.g., influence) the operation (e.g., functions) of the device.

A user interface may provide information to a user. A user may receive visual and/or audible information from a user interface. A user may receive visual information via devices that visually display information (e.g., LCDs, LEDs, light sources, graphical and/or textual display, display, monitor, touchscreen). A user interface may include a communication circuit for transmitting information to an electronic device for presentation to a user. For example, a user interface may wirelessly transmit information to a smart phone for presentation to a user.

A user interface may include voice to text or voice to instructions to a processor so that a user may interact with the user interface audibly.

Figure 3:
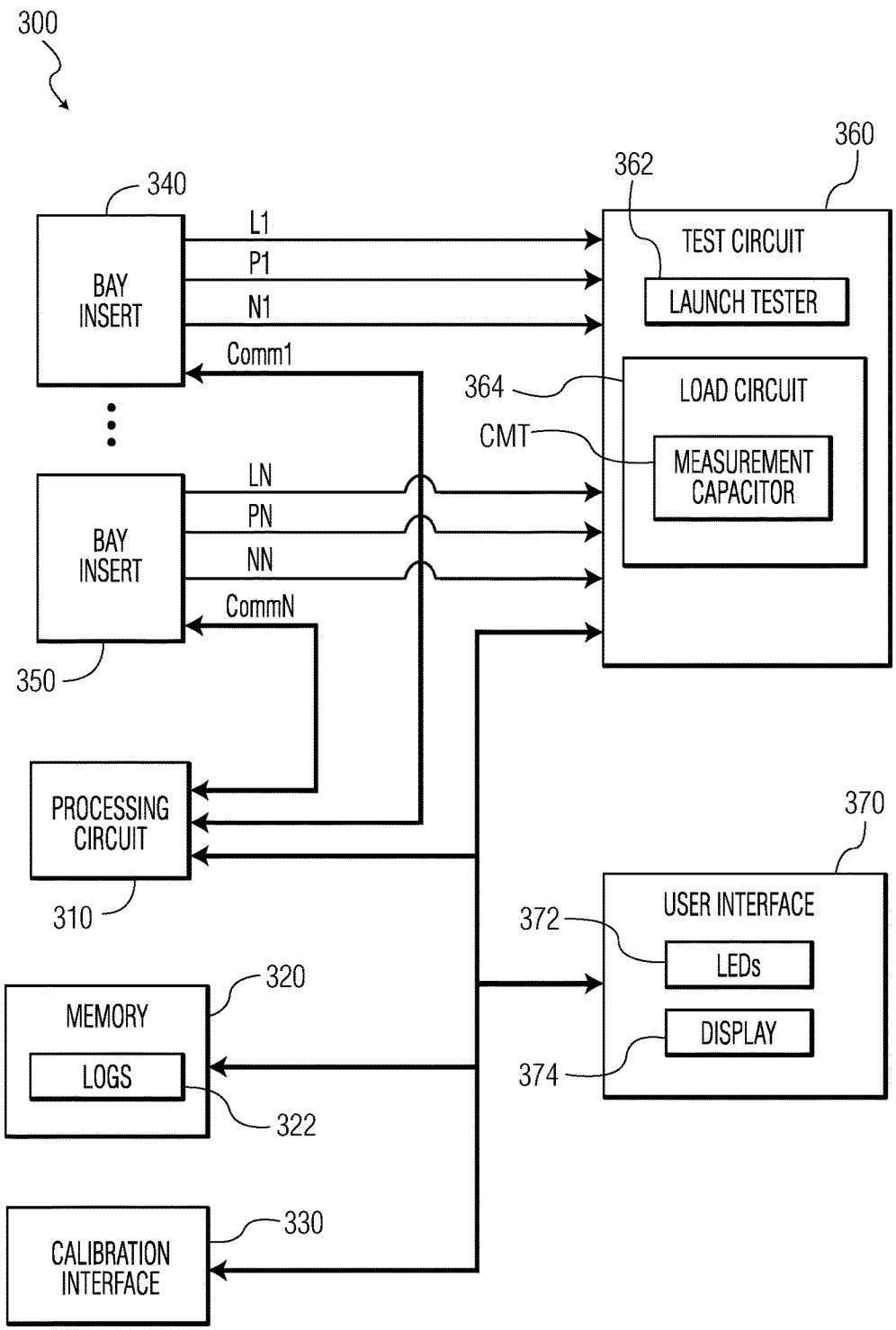
FIG. 3 is a functional block diagram of an implementation of the tester of FIG. 1.
Figure 4:
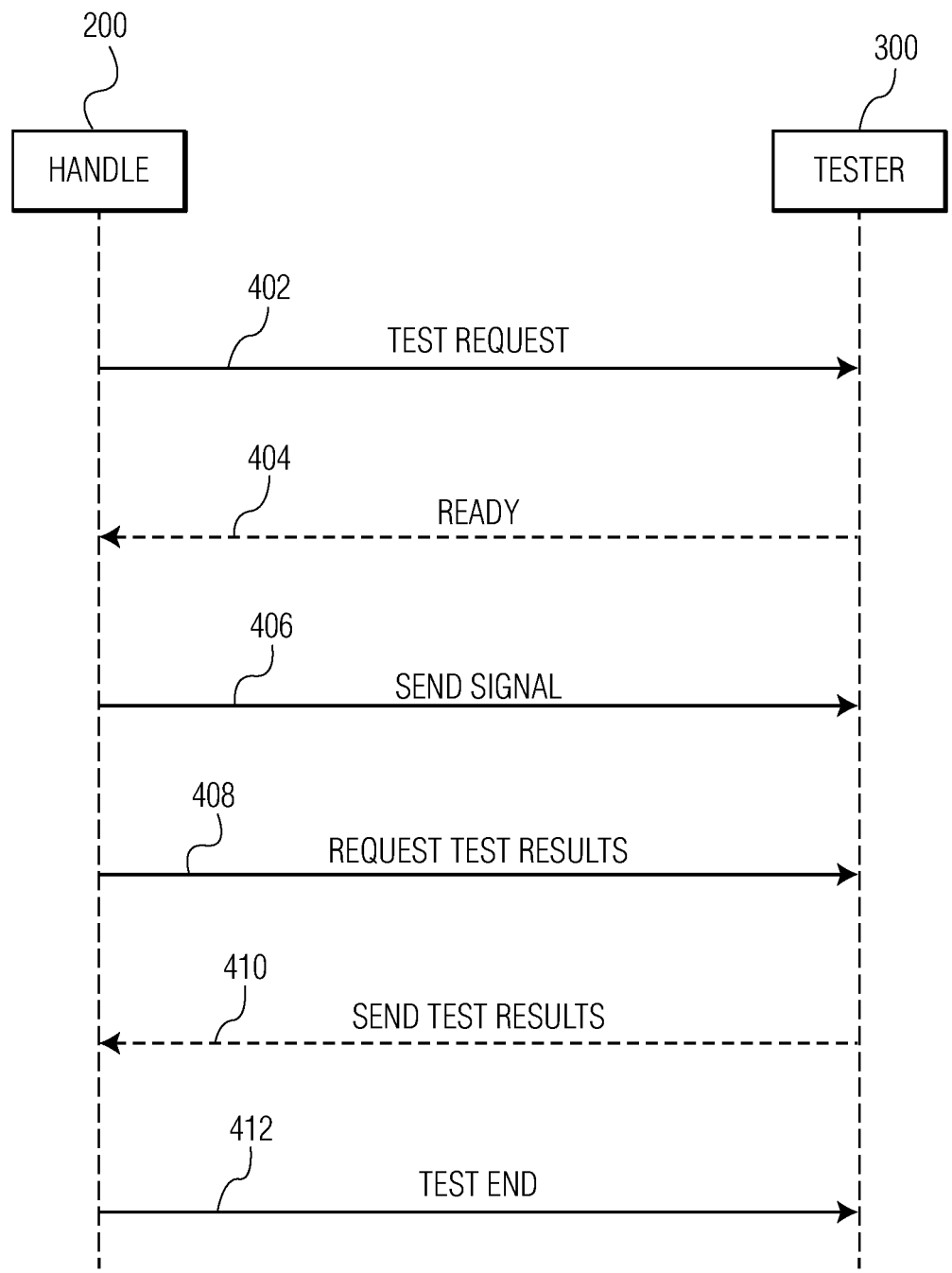
FIG. 4 is a sequence diagram showing messages communicated between the CEW and the tester.

Tester 300 of FIG. 3 is an implementation of tester 120. Tester 300 performs the functions of a tester and/or tester 120 discussed above and herein. Tester 300 may include bay insert 340 and 350, processing circuit 310, memory 320, calibration interface 330, test circuit 360, and user interface 370. A test circuit may include launch tester 362, and load circuit 364. Load circuit 364 may include measurement capacitor CMT. User interface 370 may include LEDs 372 and display 374. Memory 320 may include logs 322. Test circuit 360 may further include a circuit (e.g., bay detector) for detecting which bay of the handle provides a pulse of the stimulus signal.

Processing circuit 310, memory 320, and user interface 370 may perform the functions of a processing circuit, a memory, and a user interface respectively as discussed above.

A bay insert is a plug (e.g. male fitting) of the tester that may be inserted into a bay (e.g., female receptacle) of a handle. The bay receives and at least partially contains the plug. A bay insert may be placed into a bay in place of a deployment unit during calibration. A bay insert may include conductors (e.g., terminals). A bay may include conductors. Inserting a bay insert into a bay electrically couples the conductors of the bay insert to the conductor of the bay.

For example, bay insert and bay include the conductors labeled L1 (e.g., launch 1), P1 (e.g., positive stimulus 1), N1 (e.g., negative stimulus 1), LN (e.g., launch N), PN (e.g., positive stimulus N), and NN (e.g., negative stimulus N) respectively. Electrical signals (e.g. L1, P1, N1, LN, PN, NN) may be differential or referenced to a common ground. Inserting a bay insert into a bay electrically couples the signals of the bay insert to their matching counterpart (e.g., L1 to L1, P1 to P1, and so forth) in the bay. An insert may further include one or more conductors that electrically couple the tester to the handle so that the handle may communicate with the tester.

In an implementation, tester 300 includes bay insert 340 and bay insert 350. During testing, bay insert 340 and bay insert 350 are inserted into bay 240 and bay 250 of handle 200 respectively.

A calibration interface enables communication between the tester and a user. Via a calibration interface, a tester may provide information and/or instructions to a user and a user may provide information and/or instructions to the tester. The calibration interface enables a user, preferably a trained technician, to calibrate the tester. Calibrating a tester enables the tester to accurately measure physical quantities (e.g., charge per pulse, voltage magnitude, charge magnitude, time), provide accurate information for calibrating CEWs, operate reliably during calibration, and perform its operations consistently during the testing of many different CEWs.

A calibration interface may include a display that is viewable by a user, one or more indicators (e.g., LEDs, information on the display), one or more controls (e.g., switches, touchscreen) for a user to provide information and/or instructions to the tester during calibration of the tester, and one or more ports (e.g., connectors) for connecting instruments (e.g., volt meter, digital volt meter, current meter, ohm meter) to the tester to calibrate the tester.

A test circuit receives signals from a CEW. The signals may include signals used by a CEW to launch electrodes from a deployment unit and stimulus signals. A stimulus signal may be provided to the tester by the CEW as a single pulse or a series of single pulses under the control of the handle. A test circuit in cooperate with a processing circuit may measure (e.g., determine, detect) and record (e.g., store) characteristics of a pulse (e.g. pulse width, voltage, current, average current, and charge) provided by a handle. A test circuit may further measure and record the shape of the pulse (e.g., signal) over time. A test circuit may further detect and report the bay insert (e.g. bay insert 340, 350) and the signals (e.g. L1, LN, P1, PN, N1, NN) associated with each bay insert that provided the pulse received by the test circuit.

A test circuit may include a load circuit. A load circuit may present a load (e.g., impedance, resistance) to a handle. The amount of the load presented may be selectable. A selectable load may be presented to a handle during testing and calibration of the stimulus signal. The load presented to the signals used to launch the electrodes may or may not be selectable. A load may also be used to detect a connection to a bay.

Figure 7:
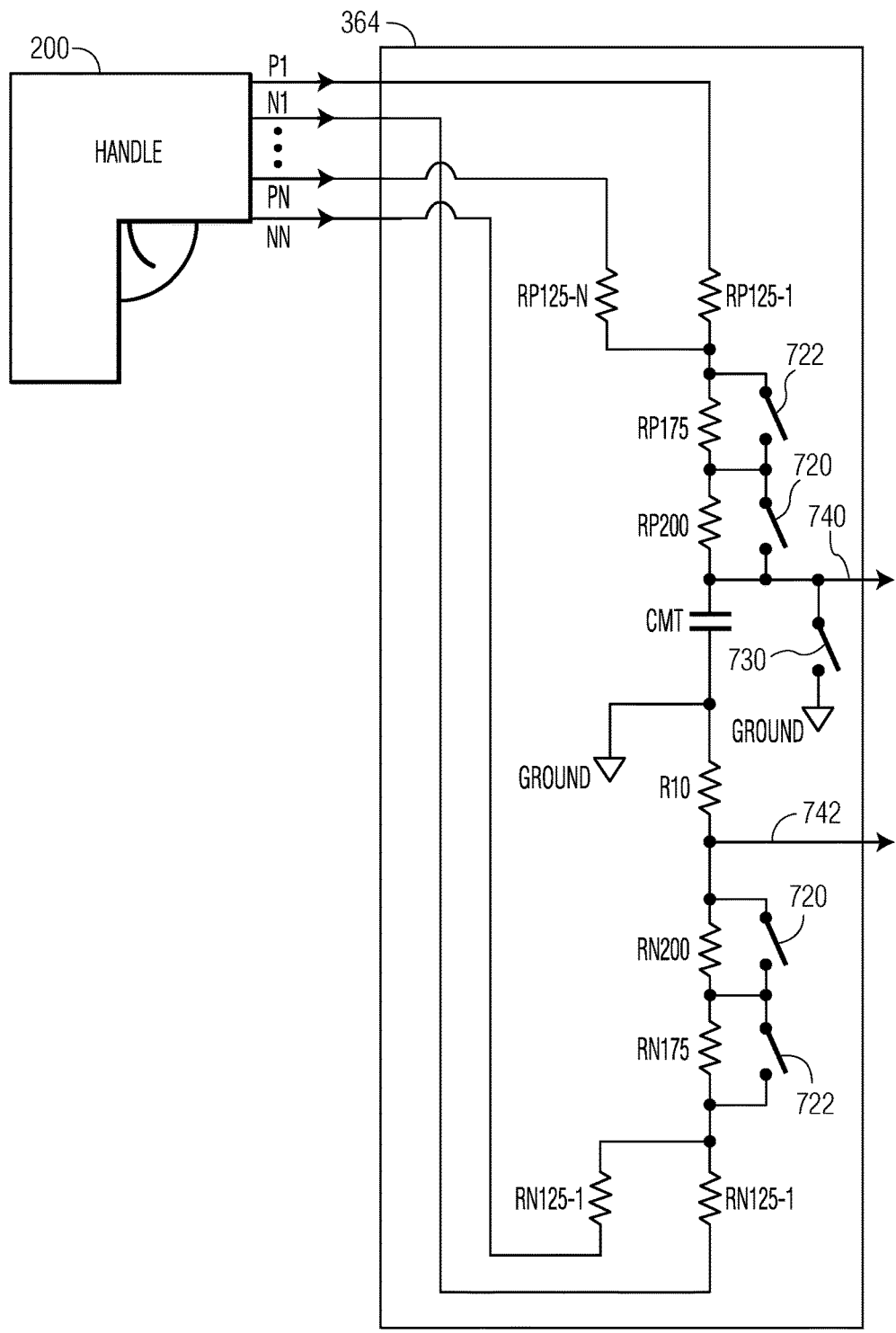
FIG. 7 is a diagram of an implementation of a circuit of the tester of FIG. 1 for measuring a pulse of the stimulus signal.

In an implementation, shown in FIG. 7, load circuit 364 includes resistors RP125-1, RP125-N, RP175, and RP200 for receiving the positive portion of the stimulus pulse provided via bay 240 and 250 and resistors RN125-1, RN125-N, RN175, and RN200 for receiving the negative portion of the stimulus pulse provided via bay 240 and 250. The values of the resistors RP125/RN125, RP175/RN175, and RP200/RN200 are 120 ohms, 175 ohms and 200 ohms respectively. Switches 720 and 722 are controlled by processing circuit 210 at the request for handle 200 to set the impedance seen by the handle 200 to 250 ohms, 600 ohms, or 1000 ohms.

A load circuit may further include a measurement capacitor. A measurement capacitor may receive and store an electric charge. The voltage across the measurement capacitor is proportional to the amount of charge stored on the capacitor. A processing circuit may measure the voltage across the capacitor. A processing circuit may determine (e.g., compute, calculate) the charge stored on the measurement capacitor.

In an implementation, load circuit 364 includes measurement capacitor CMT shown in FIG. 7. The charge stored on measurement capacitor CMT after test circuit 360 receives a pulse of the stimulus signal from handle 200 represents the amount of charge provided by the pulse. Processing circuit 310 may measure the voltage across measurement capacitor CMT at terminal 740. Processing circuit 310 may use the voltage measured across measurement capacitor CMT to calculate the charge provided by the pulse and stored on measurement capacitor CMT. The amount of charge provided by the pulse, as measured across measurement capacitor CMT, may be reported to handle 200.

Prior to receiving a next pulse from handle 200, processing circuit 310 may close switch 730 to discharge measurement capacitor CMT. Discharging measurement capacitor CMT removes the charge stored on measurement capacitor CMT from a previous pulse and prepares measurement capacitor CMT to store the charge from a next pulse of the stimulus signal.

In an implementation, load circuit 364 includes resistor R10 as shown in FIG. 7. The waveform shape (e.g., rise time, fall time, pulse duration, pulse magnitude) of a pulse may be captured by processing circuit 310 across resistor R10. Processing circuit 310 may measure the voltage across R10 at terminal 742. Processing circuit 310 may use the voltage measured across R10 to calculate the charge provided by the pulse. The information (e.g., characteristics) measured by tester 300 with respect to a pulse of the stimulus signal may be reported to handle 200. Resistor R10 may operate as a voltage divider in load circuit 364. In an implementation, resistor R10 is 10 ohms.

Figure 5:
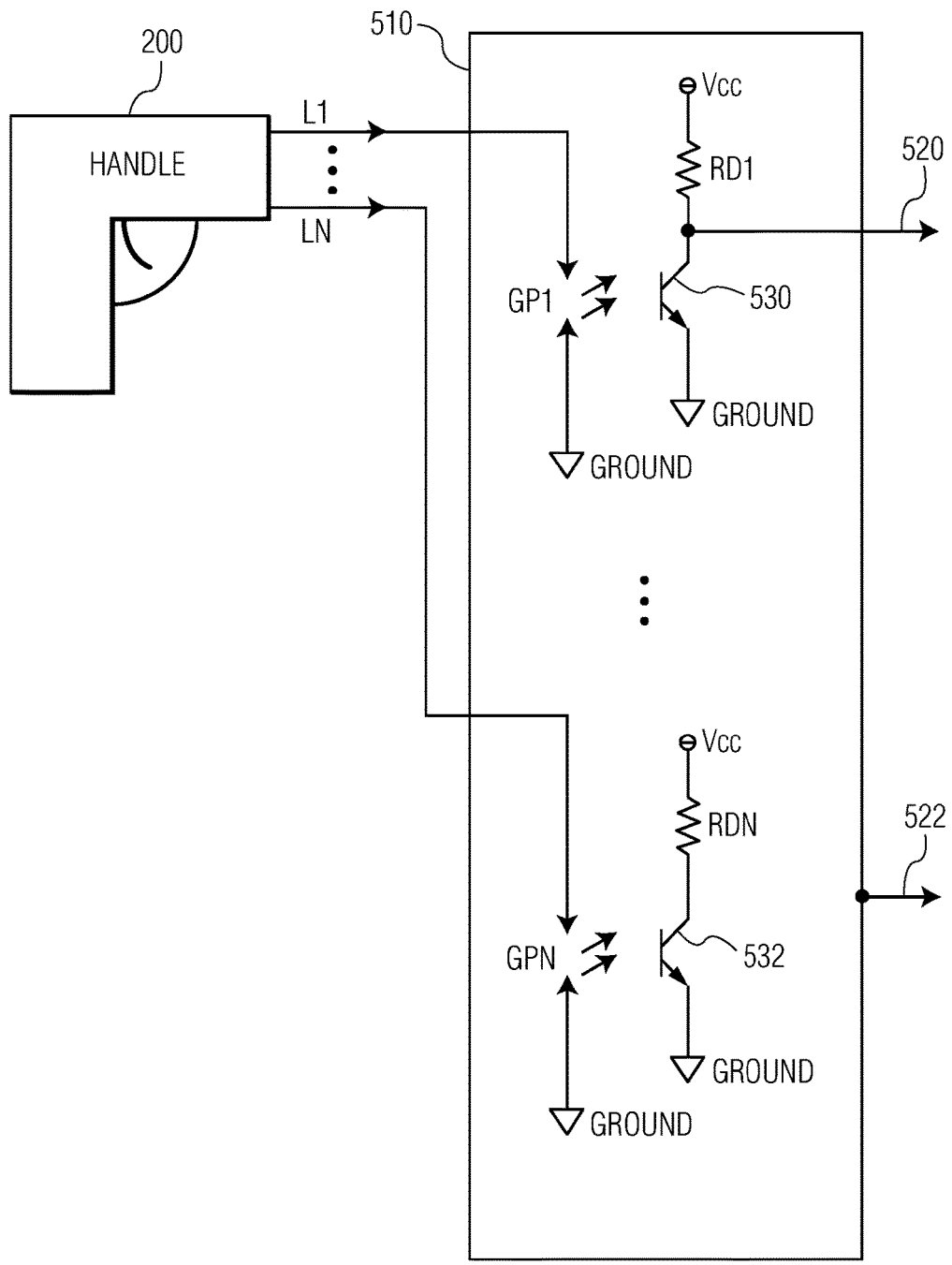
FIG. 5 is a diagram of an implementation of a circuit of the tester of FIG. 1 for detecting a launch signal.

Test circuit 360 also includes launch tester 362 for receiving the signals provided by a handle 200 for launching electrodes from a deployment unit. Launch tester 362 may identify whether a launch signal was provided by bay 240 (e.g., L1) or bay 250 (e.g., LN). In an implementation of launch tester 362, launch tester 510 in FIG. 5 includes gaps of air GP1 and GPN. The length of gaps GP1 and GPN may be set so that a launch signal has a minimum voltage threshold to be able to ionize air in gaps GP1 and GPN. The light from the ionization (e.g., arc) coincident with ionization causes current to flow in photo transistors 530 and 532 respectively thereby indicating that the launch signals were received. The flow of current in photo transistors 530 and 532 may be detected by processing circuit 310 via a change in the voltage at nodes 520 and 522.

Figure 6:
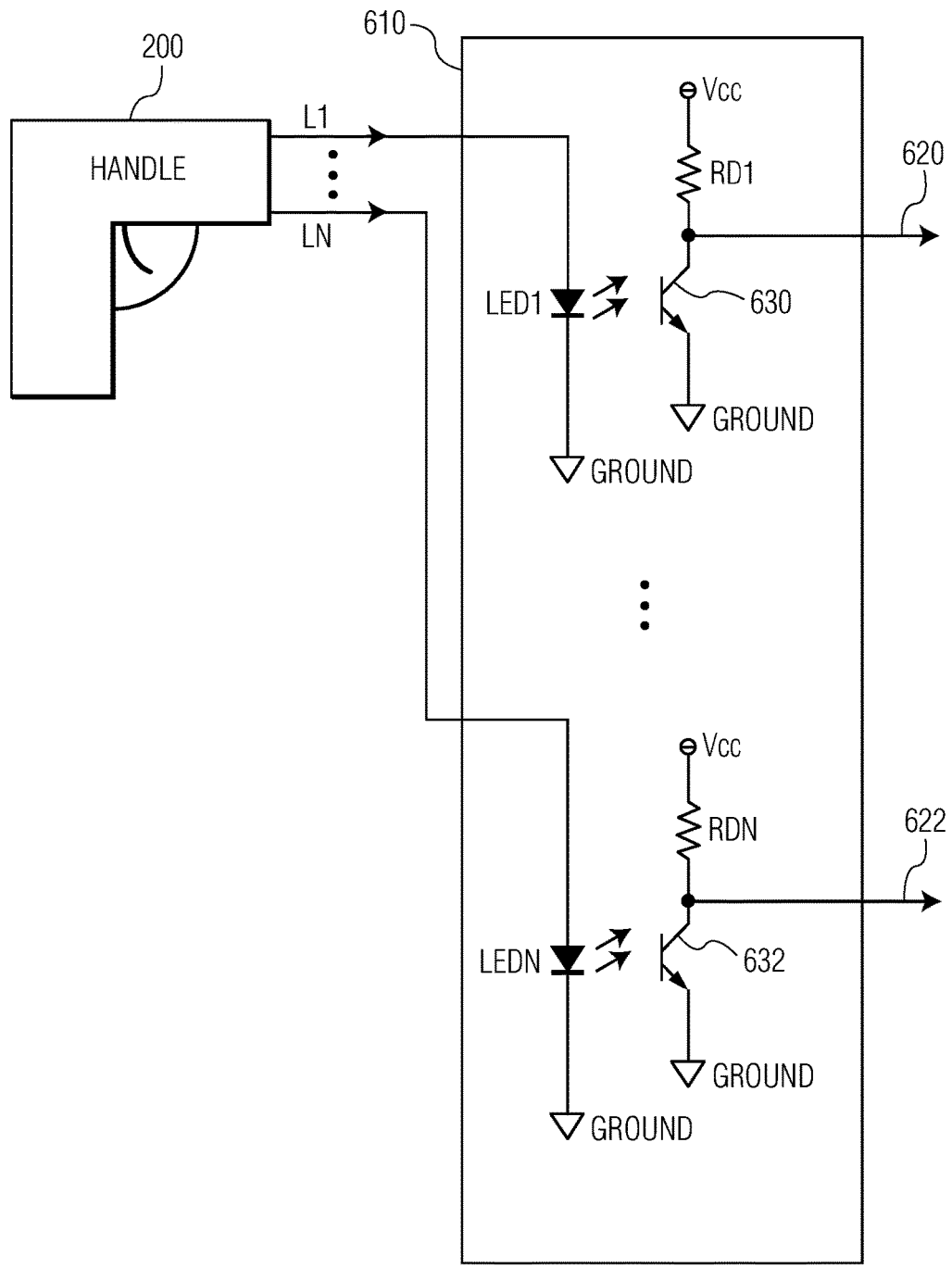
FIG. 6 is a diagram of another implementation of a circuit of the tester of FIG. 1 for detecting a launch signal.

In another implementation of launch tester 362, launch tester 610 of FIG. 6 includes light emitting diodes LED1 and LEDN. The diodes may be selected so that a launch signal has a minimum voltage threshold to cause the LEDs to emit light. The light from LED1 and LEDN causes current to flow in photo transistors 630 and 632 respectively thereby indicating that the launch signals were received. The flow of current in photo transistors 630 and 632 may be detected by processing circuit 310 via a change in the voltage at nodes 620 and 622.

The functions of a user interface are discussed above. In an implementation of tester 300, user interface 370 includes light emitting diodes (e.g., LEDs) 372 and display 374.

A display may be used to present information to the user. Information may include text and/or video information. Visual information presented by a display may further include audio information that relates to and/or explains the video information. A display may include touch screen technology for providing a display of information and for receiving input (e.g., instructions) from a user. A touch screen display may present one or more controls (e.g., icons) for manual selection by a user.

During the process of calibrating a handle, the handle and the tester communicate with each other. Through the communications, the handle controls the tests that are performed by the tester. The handle requests and receives test results from the tester. The information communicated between the handle and the tester may be accomplished in any suitable manner. Communication may include sending and/or receiving digital data and/or analog signals.

An implementation, the process of communication to perform calibration that occurs between handle 200 and tester 300 includes request 402, ready 404, send signal 406, request results 408, send result 410, and test end 412.

In request 402, handle 200 sends a test request to tester 300. A test request may include parameters to specify test set up such as bay number to be tested, load impedance, and test type (e.g., stimulus, launch). Because a test is not performed until a test request is formed and provided by handle 200 to tester 300, handle 200 controls which tests are performed.

In ready 404, tester 300 sends a ready signal to handle 200. After tester 300 receives a test request, processing circuit 310 of tester 300 initializes the tester and sets the circuits of test circuit 360 to perform the test requested. When tester 300 is ready to receive the signal from handle 200, tester 300 sends a ready signal to handle 200.

In send signal 406, handle 200 sends a test signal (e.g. launch signal, stimulus signal) to tester 300. Tester 300 detects the signal sent by handle 200 and measures (e.g. voltage, charge, bay) the stimulus. Processing circuit 310 records the results of the test measurements (e.g., indicia of the test measurements). In send signal 406, handle 200 not only sends the stimulus pulse to tester 300, but handle 200 also measures characteristics of the pulse independent of tester 300.

In request result 408, handle 200 sends a results request to tester 300. Tester 300 receives a results requests, processing circuit 310 prepares a message that reports results of test measurements.

In send result 410, tester 300 sends a message to handle 200 that contains the results of a test (e.g., amount of charge delivered by a pulse of the stimulus signal, detection of launch signal). Handle 200 receives the test results from tester 300. The processing circuit 210 of handle 200 may store test results in memory 220. Handle 200 may transfer test results to a server 170 via a network 150.

In test end 412, handle 200 sends a message to tester 300 that test session is ended.

Processes request 402, ready 404, send signal 406, request results 408 and send result 410 may be repeatedly performed, under the control of handle 200, until calibration is accomplished.

Handle 300 repeatedly sends test request 402 to tester 300 for the same or different tests and requests the test results for each test until handle 200 has sufficient information to calibrate its operation to within the specified ranges of operation. When tester 200 has the information it needs to adjust its own operation, tester 200 sends test end 412 message to tester 300 to terminate the test.

If after repeated tests, tester 300 cannot bring its operation into the range of desired performance, tester 300 provides a notice of the failure to the user, tester 300, and/or the agency of the user and sends test end 412 message to terminate the test.

Figure 8:
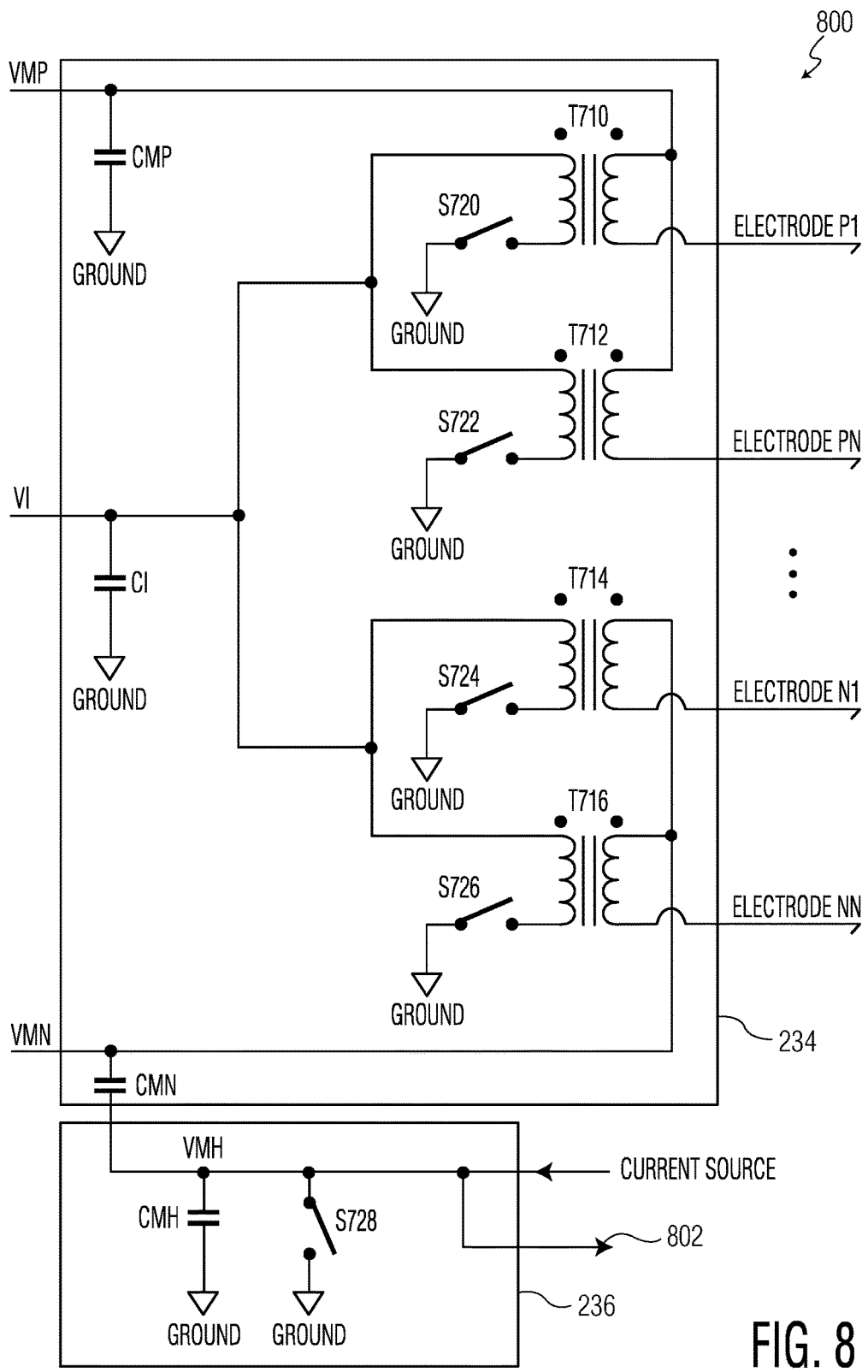
FIG. 8 is a diagram of an implementation of a circuit of the CEW of FIG. 1 for providing a pulse of the stimulus signal and measuring a pulse of the stimulus signal.
Figure 9A:
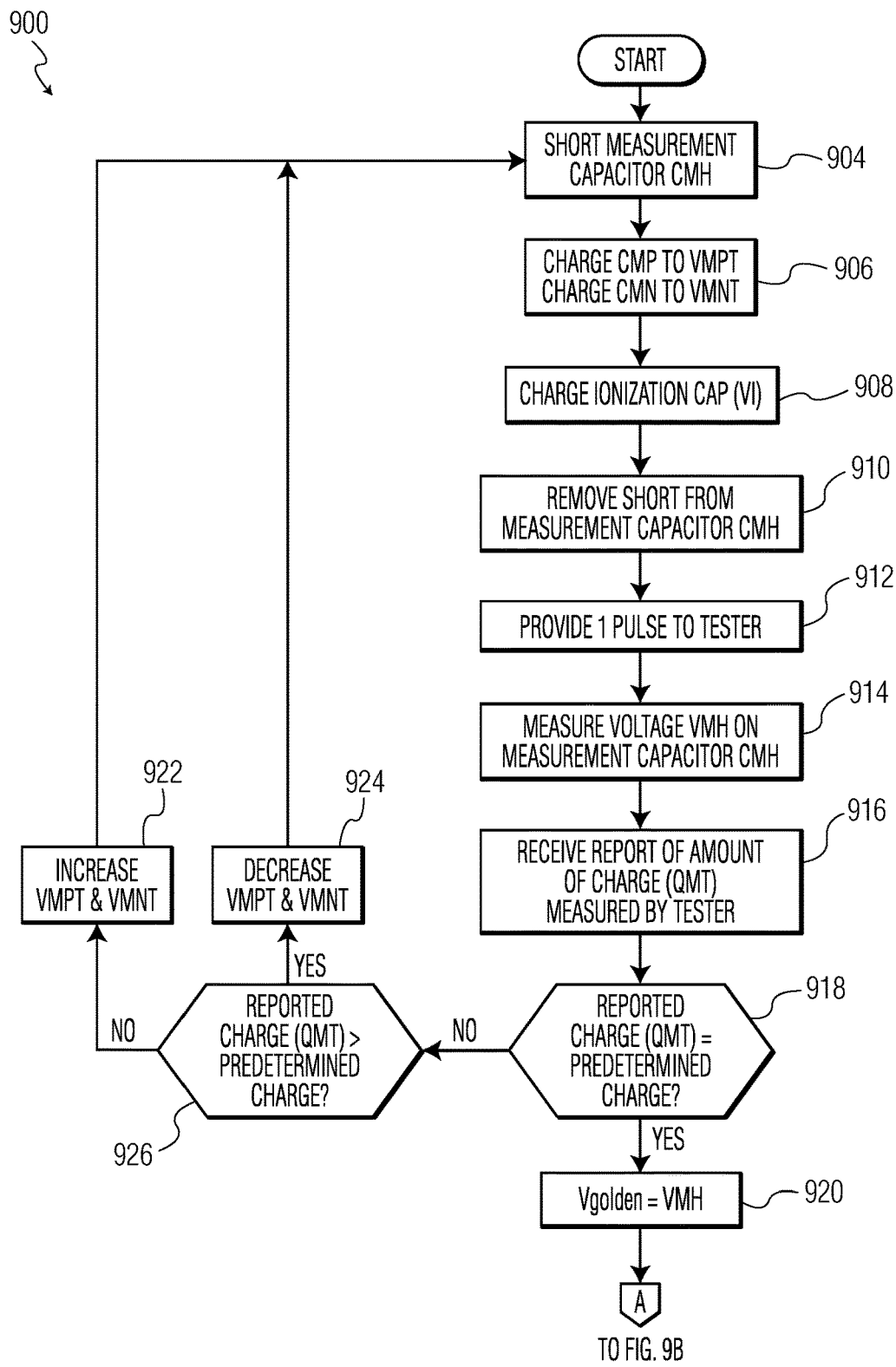
FIGS. 9A and 9B are a flow chart of a method for calibrating a CEW according to various aspects of the present invention.
Figure 9B:
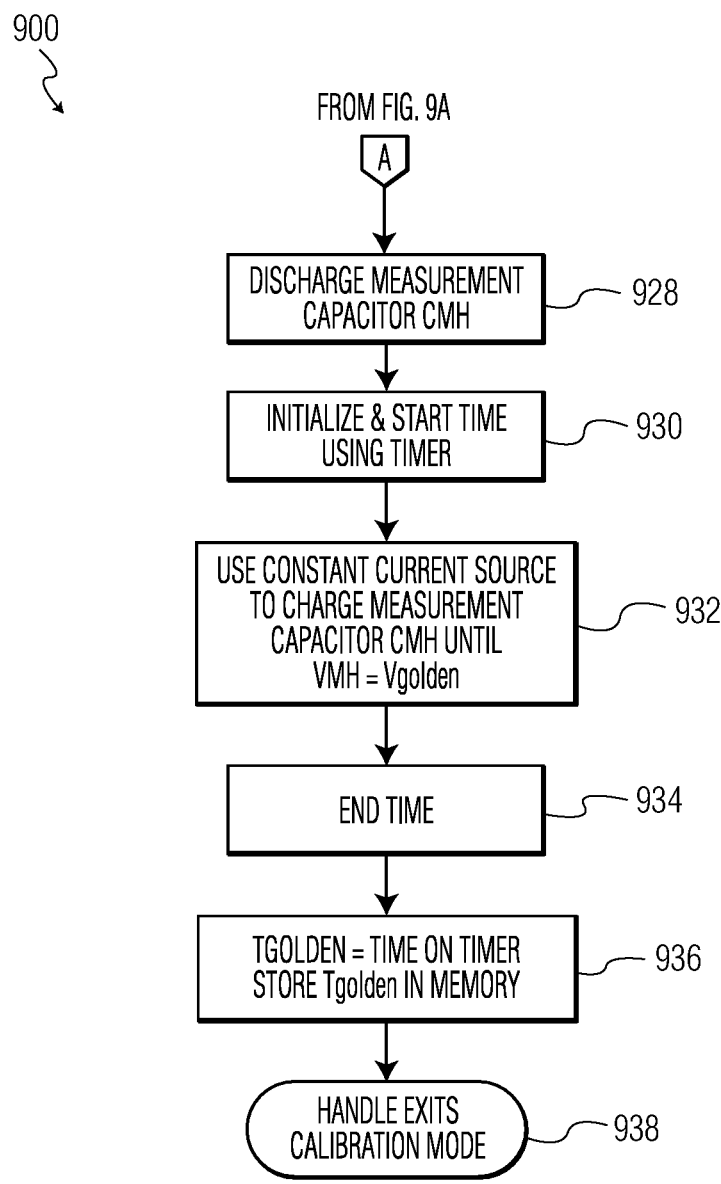
Figure 10:
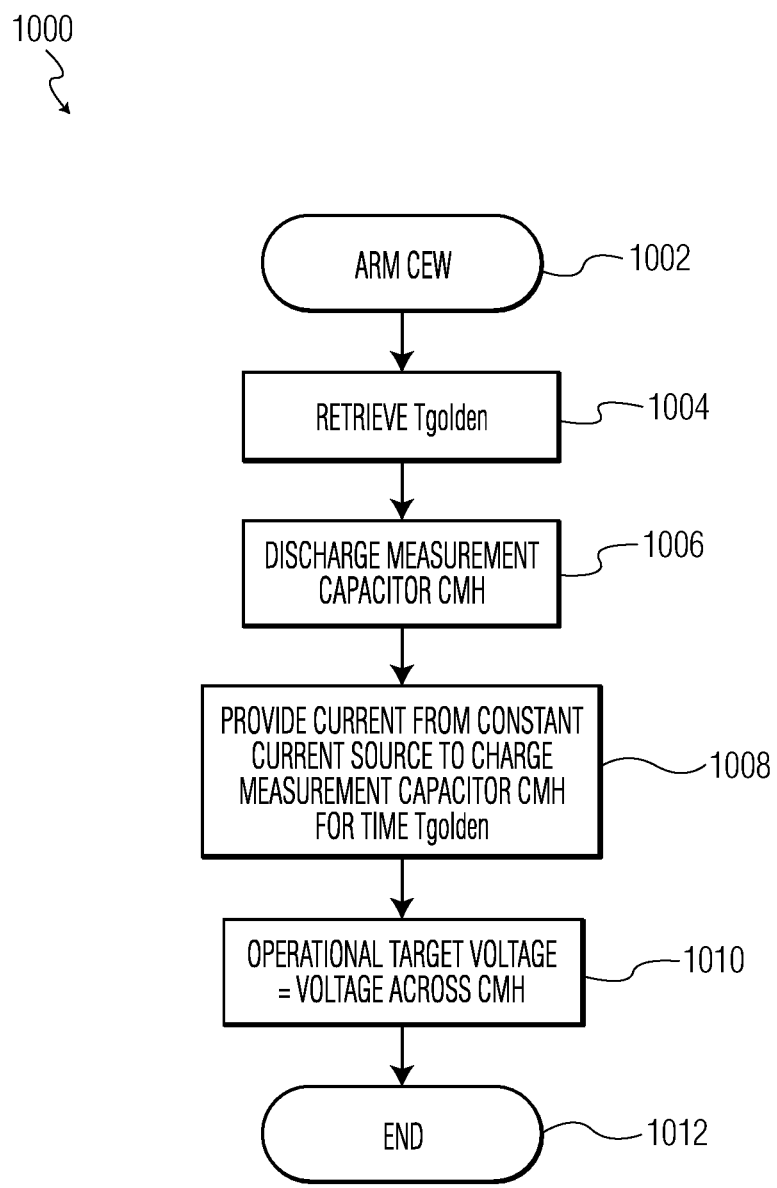
FIG. 10 is a flow chart of a method performed by a CEW, after calibration, to generate a reference voltage that relates to a calibrated amount of charge according to various aspects of the present invention.
Figure 11:
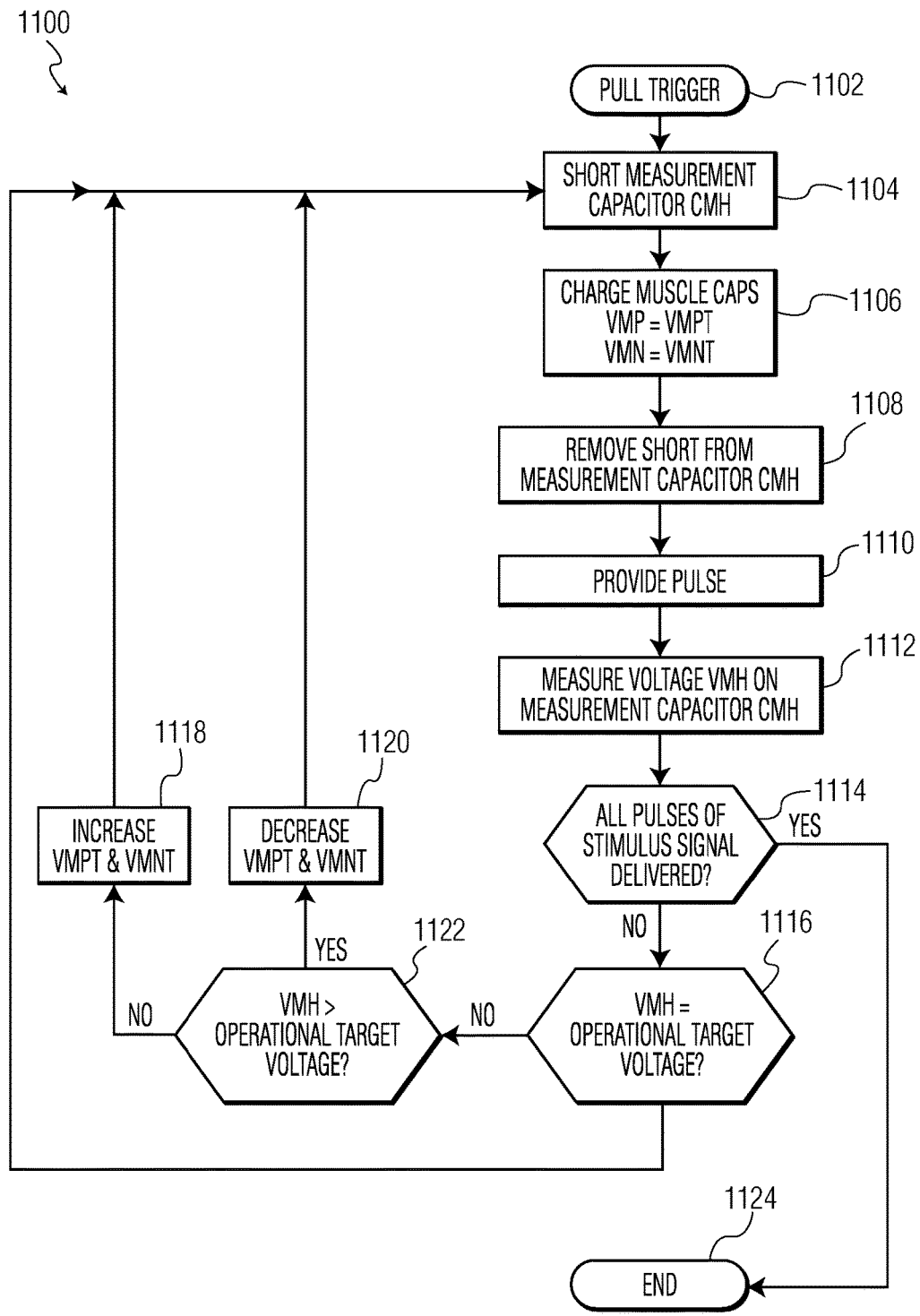
FIG. 11 is a flow chart of a method performed by a CEW, after calibration, for adjusting an amount of charge delivered by the pulses of a stimulus signal for providing a calibrated charge per pulse.

Circuit 800 of FIG. 8 is an implementation of a high voltage circuit of handle 200 that provides the stimulus pulse. Circuit 800 includes a stimulus generator 234 and a detector 236. The stimulus generator 234 includes capacitors CI, CMP, CMN, transformers T710, T712, T714, T716, and switches S720, S722, S724, S726. The detector 236 includes measurement capacitor CMH and switch S728. Capacitors CI, CMP, and CMN are part of the stimulus generator and are charged to provide a stimulus pulse. The polarity of the charge on capacitor CMP is the opposite of the polarity of the charge on CMN. In this example, we will suppose that voltage across capacitors CI and CMP is positive with respect to ground while the voltage across capacitor CMN is negative.

After the capacitors are charged, processing circuit 210 of handle 200 selects one positive electrode and one negative electrode. The positive electrodes (e.g. electrode P1, electrode PN) are those electrodes that are coupled to capacitor CMP through the secondary winding of transformers T710 and T712 and the negative electrodes (e.g. electrode N1, electrode NN) are those electrodes that are coupled to capacitor CMN through the secondary winding of transformers T714 and T716. When processing circuit 210 closes the switches (e.g., SCR) on one negative and one positive electrode, for example electrode P1 and electrode N1, the current from capacitor CI discharges into the primary winding of the transformer coupled to the selected electrodes. In this example, switch S720 and switch S724 are closed so that the charge from capacitor CI discharges into the primary winding of transformers T710 and T714. The current in the primary winding induces a current at a higher voltage (e.g., 50,000 volts) in the secondary winding which causes ionization in a gap of air between the selected electrodes and the target as discussed above. Most of the charge on capacitor CI is spent (e.g., used) ionizing air in the gap. Once the ionization path is established, the charge from capacitors CMP and CMN discharges through the target via the ionization path. The discharge of capacitors CI, CMP, and CMN produces a pulse of a stimulus signal.

Measurement capacitor CMH may be used to measure the charge (via voltage VMH) sent to the electrodes into the target or into the load circuit of the tester. The voltage VMH across measurement capacitor CMH may be measured at terminal 802 by processing circuit 210. The charge stored on measurement capacitor CMH after the discharge of capacitors CI, CMP, and CMN represents the amount of charge provided by the pulse of the stimulus signal. Processing circuit 210 may use the voltage measured across measurement capacitor CMH to calculate the charge provided by the pulse and stored on measurement capacitor CMH.

Prior to sending a next pulse, processing circuit 210 may close switch S728 to discharge measurement capacitor CMH. Discharging measurement capacitor CMH removes the charge stored on measurement capacitor CMH from a previous pulse and prepares measurement capacitor CMH to store the charge from a next pulse of the stimulus signal.

In the case of measuring the charge provided by a pulse of the stimulus signal, send result 410 sends the amount of charge measured by tester 300 to handle 200. Because handle 200 independently measured the amount of charge (via voltage VMH) provided by the same pulse of the stimulus signal, as discussed above, handle 200 is in a position to record the voltage VMH across measurement capacitor CMH that represents the predetermined amount of charge as reported by tester 300. The comparison of the independently measured charge enables handle 200 to adjust its circuits and its operations so that each pulse of a stimulus signal has the highest likelihood of providing a predetermined amount of charge. Providing a predetermine amount of charge with each pulse of the current increases the likelihood of interfering with locomotion of a target by locking up the muscles of the target.

In an implementation, the predetermined amount of charge is 63 microcoulombs per pulse. Preferably, each pulse of the stimulus signal provides the predetermined amount of charge per pulse. Factors that determine the predetermined amount of charge for impeding locomotion of a target include the number of pulse provided in a stimulus signal, the pulse rate, the pulse width, the pulse profile (e.g., shape), and time between pulses. The predetermined amount of charge may, taking the other factors of the stimulus signal into account, may fall in a range of 40 microcoulombs per pulse to 100 microcoulombs per pulse.

A pulse of a stimulus signal provides about the same amount of charge (e.g., close to) as the predetermined amount of charge when the pulse of the stimulus signal provides an amount of charge that is the predetermined amount of charge pulse or minus five percent (5%) of the predetermined amount of charge. For an implementation in which the predetermined amount of charge is 63 microcoulombs, a pulse of the stimulus signal provides about the same amount of charge as the predetermined amount of charge when the pulse provides between 63 microcoulombs minus five percent (e.g., 3.15 microcoulombs), which is 59.85 microcoulombs and 63 microcoulombs plus five percent (e.g., 3.15 microcoulombs), which is 66.15 microcoulombs. For an implementation in which the predetermined amount of charge is 100 microcoulombs, a pulse of the stimulus signal provides about the same amount of charge as the predetermined amount of charge when the pulse provides between 100 microcoulombs minus five percent (e.g., 5 microcoulombs), which is 95 microcoulombs and 100 microcoulombs plus five percent (e.g., 5 microcoulombs), which is 105 microcoulombs.

Methods 900, 1000, and 1100 are performed by a handle and/or a tester to calibrate a handle. Method 900 is performed by the cooperation of a handle, for example handle 200, and a tester, such as tester 300. Process 1000 is performed by a handle, such as handle 200, after calibration of the handle and during initialization just after arming the handle for use. Method 1100 is performed by a handle, such as handle 200, while the handle is providing a stimulus signal. Each method is discussed below.

Method 900 is performed by a handle. It includes processes discharge 904, charge 906, charge 908, remove 910, pulse 912, measure 914, report 916, compare 918, record 920, increase 922, decrease 924, compare 926, discharge 928, start time 930, charge 932, end time 934, set 936, and exit 938.

When handle 200 provides a pulse of the stimulus signal via the selected electrodes a path for current flow is established. The path is from the positive stimulus capacitor (CMP) through the positive electrode (e.g. P1, PN), the load circuit 364 of tester 300, the negative electrode (e.g. N1, NN), the negative stimulus capacitor (CMN), and the measurement capacitor (CMH) of handle 200. At the beginning of the pulse, the voltage (VMH) on measurement capacitor CMH begins at a value of zero volts. The charge is removed from measurement capacitor CMH by closing switch S728 at the start of charging the stimulus capacitors CMP and CMN. When closed, switch S728 shorts measurement capacitor CMH. Once the stimulus capacitors are charged and it is time to release a pulse of the current, switch S728 is opened and the current of the pulse flows through all of the components of the above path.

As the current flows through the path, the charge the stimulus capacitors CMP and CMN is transferred to the measurement capacitor CMH. As the pulse of the stimulus signal ends, the amount of charge delivered by the pulse of the stimulus signal is stored on measurement capacitor CMH. The voltage (VMH) on handle measurement capacitor CMH relates to the amount of charge delivered by the pulse of the stimulus signal. The amount of charge reported by the tester 300 is the amount of charge collected by measurement capacitor CMH, so the voltage VMH across measurement capacitor CMH relates to the amount of charge reported by tester 300.

When tester 300 reports that the pulse of the stimulus signal delivered the predetermined amount of current, handle 200 knows that the amount of charge delivered by the pulse is the predetermined amount of charge. Handle 200 then knows that the amount of charge on measurement capacitor CMH and the voltage VMH across measurement capacitor CMH represents the predetermined charge for the current environmental conditions. Handle 200 records the voltage across measurement capacitor CMH as the golden voltage of handle 200 (e.g., golden voltage, Vgolden) for the current environmental conditions. Under the environmental conditions, handle 200 knows that each time it measures Vgolden across measurement capacitor CMH that handle 200 has delivered the predetermined amount of charge in the pulse.

In process discharge 904, the handle initializes measurement capacitor CMH to measure the amount of charge provided by a pulse of the current. Measurement capacitor CMH is initialized by removing the charge stored on measurement capacitor CMH. For example, processing circuit 210 closes switch S728 to discharge measurement capacitor CMH. Discharging measurement capacitor CMH removes the charge stored on measurement capacitor CMH from a previous pulse and prepares measurement capacitor CMH to store the charge from a next pulse of the stimulus signal. For example, processing circuit 210 discharges measurement capacitor CMH by closing switch S728 so that measurement capacitor CMH is grounded, thereby removing all charge stored by measurement capacitor CMH.

In process charge 906, the handle 200 charges capacitors CMP and CMN to a voltage so that capacitors CMP and CMN will provide a target amount of charge. The target amount of charge is the predetermined amount of charge discussed above to provide a more effective stimulus signal. Processing circuit 210 may set target voltages (e.g., VMPT, VMNT), discussed in more detail below, to which capacitors CMP and CMN respectively are charge prior to providing a pulse of the stimulus signal. Target voltages VMPT and VMNT are adjusted as discussed below to change the amount of charge provided by a pulse of the stimulus signal with the goal of providing the predetermined amount of current or an amount close thereto. On a first iteration of process charge 906, the target voltages VMPT and VMNT for charging capacitors CMP and CMN respectively (e.g., VMPT across capacitor CMP, VMNT across capacitor CMN) may be set by estimating the target voltages based on stored data, by using empirical data to determine preliminary values, or to default values stored by handle 200. Processing circuit 210 controls the charging of capacitors CI, CMP and CMN. Processing circuit 210 maintains in memory the values of the target voltages VMPT and VMNT and controls the charging process so that capacitors CMP and CMN are charged to the target voltages.

In process charge 908, the handle charges ionization capacitor CI to a target voltage. As discussed above, capacitor CI provides the ionization portion of the current pulse. For example, processing circuit 210 of handle 200 controls the charging of capacitor CI.

In process remove 910, the handle removes the short from measurement capacitor CMH. This is timed to happen just before a pulse of the stimulus signal is sent. Measurement capacitor CMH is initialized to start collecting charge delivered by the pulse of the stimulus signal. For example, processing circuit 210 opens switch S728 to allow measurement capacitor CMH to collect charge from a pulse of the stimulus signal.

In process pulse 912, the handle 200 may send a pulse of the stimulus signal to tester 300. The pulse of current is a pulse of a stimulus signal as discussed above. For example, processing circuit 210 may select the signals (e.g., P1, N1, PN, NN) of bay 240 and/or bay 250 that provide the pulse to the signals (e.g., P1, N1, PN, NN) of bay inserts 340 and 350. Pulse generation is discussed above.

After handle 200 provides the pulse of the stimulus signal to tester 300, process measure 914 measures the voltage VMH on measurement capacitor CMH at terminal 802. For example, processing circuit 210 measures the voltage across measurement capacitor CMH.

In process report 916, handle 200 receive a message from tester 300. The information provided in the message includes the amount of charge measured by tester 300 for the pulse that was received and for which handle 200 has measured the voltage across measurement capacitor CMH. Tester 300 determines the amount of charge provided by a pulse by measuring the voltage across capacitor CMT and calculating the amount of charge on the capacitor. As discussed above, the amount of charge on capacitor CMT after the current pulse has been received represents the amount of charge delivered by the current pulse.

Handle 200 uses the reported amount of charge for the pulse to the voltage measured across measurement capacitor CMH. The amount of charge reported by tester 300 informs handle 200 that in the environment in which the test is being performed, the voltage measured across measurement capacitor CMH means that handle provided a specific amount of charge.

The term environment includes the physical characteristics of handle 200 and its ambience. Physical characteristics of the ambience of an environment include any conventional physical property that occurs in an area including ambient temperature, humidity, presence of direct sun light, presence of moisture (e.g., rain), and particulates (e.g., smoke, fog). Physical characteristics of a handle include any conventional physical property of a handle including operating temperature of the handle, age of the components of the handle, and presence of moisture (e.g., condensate).

For example, if handle 200 measures voltage V1 across measurement capacitor CMH and tester 300 reports 60 microcoulombs, handle 200 knows that each time it measures voltage V1 across measurement capacitor CMH, it has provided a pulse that delivered 60 microcoulombs. If handle 200 measures voltage V2 across measurement capacitor CMH and tester 300 reports 65 microcoulombs, handle 200 knows that each time it measures voltage V2 across measurement capacitor CMH, it has provided a pulse that delivered 65 microcoulombs or about 65 microcoulombs. Handle 200 can use the information that relates the voltage across measurement capacitor CMH to an amount of charge to adjust its own circuits to provide the predetermined (e.g., target) amount of charge. For example, handle 200 can adjust, either increase or decrease, the voltage on capacitors CMP and CMN primarily and CI secondarily to increase or decrease the amount of charge provided in a pulse of the stimulus signal. By adjusting the amount of charge on the capacitors (e.g., CI, CMP, CMN) of the high voltage circuit (e.g., circuit 800), handle 200 can use the information provided by tester 300 to determine the circuit settings that deliver the predetermined amount of charge.

The handle may use measurements (e.g. voltage across CMH) from several pulses and use corresponding reports for each pulse from the tester to average test data (e.g. simple moving average, weighted moving average) to determine the amount of charge delivered by any one pulse.

The relationship between the voltage across measurement capacitor CMH and the reported amount of charge applies only in the environmental conditions (e.g., temperature, humidity) of the calibration environment at the time the measurements are performed. In a different environment, as discussed below, the relationship between the voltage across measurement capacitor CMH and the amount of charge provided by a pulse of the stimulus signal may be different. The physical characteristics of the environments may be different.

In process compare 918, the amount of charge (e.g., QMT) reported by tester 300 to handle 200 in process report 916 is compared to the amount of charge that has been predetermined to improve the effectiveness of the stimulus signal. As discussed above, providing the predetermined amount of charge or about the same as a predetermined amount of charge per pulse may improve the effectiveness of the stimulus signal thereby resulting in skeletal muscle lockup. If the amount of charge delivered by the pulse provided in process pulse 912 is about the same as the predetermined amount of charge, handle 200 may perform further processes (processes 920 and 928-938, method 1000, method 1100) so that handle 200 can deliver pulses of current that provide the predetermined amount of charge, or close thereto, in an environment that is different from the calibration environment. If the amount of charge delivered by the pulse is the same or about the same as the predetermined amount of charge, execution moves to process record 920.

If the amount of charge delivered by the pulse provided in process pulse 912 is not the same or about the same as the predetermined amount of charge, execution moves to process compare 926 and following processes (e.g., 922-924) so that handle 200 may adjust the charge delivered by a next pulse of the stimulus signal so that it may be closer to the predetermined amount of charge.

In process compare 926, the amount of charge reported by tester 300 is compared to the predetermined charge to determine whether the reported amount of charge is greater than the predetermined amount of charge. If the amount of reported charge is greater than the predetermined charge, handle 200 determines that it should decrease the amount of charge delivered by a next pulse of the stimulus signal and execution moves to process decrease 924. If the amount of reported charge is not greater than the predetermined charge, handle 200 determines that it should increase the amount of charge delivered by the next pulse of the stimulus signal and execution moves to process decrease 924. As discussed above, handle 200 adjusts the amount of charge delivered by a pulse by adjusting the amount of charge stored on capacitors CMP and CMN prior to delivering the pulse.

In process increase 922, handle 200 increases the amount of charge stored on capacitors CMP and CMN prior to delivering a next pulse of the stimulus signal. The amount stored on capacitors CMP and CMN is increased by charging the capacitors to a higher voltage prior to delivering the pulse. Processing circuit 210 may maintain a record of the voltages to which capacitors CMP and CMN are charged for each pulse provided. Processing circuit 210 may use the record of voltages and the information regarding the amount of charge provided by each pulse to determine a target voltage, VMPT and VMNT, for capacitors CMP and CMN respectively. Processing circuit 210 may adjust the target voltage up or down, in the case of process increase 922 the adjustment is up, to adjust the voltage to which capacitors CMP and CMN are charged and thereby the amount of charge delivered by a pulse.

Adjusting the target voltages VMPT and VMNT up increases the voltage to which processing circuit 210 charges capacitors CMP and CMN prior to providing a pulse of the stimulus signal. Charging a capacitor to a higher voltage increases the amount of charge stored on the capacitor. Processing circuit 210 may have knowledge of the values (e.g., capacities) of capacitors CMP and CMN and may even calculate the amount of charge stored on capacitors CMP and CMN; however, handle 200 relies on tester 300 to accurately measure and report the amount of charge delivered by a pulse, so processing circuit 210 does not have a need to calculate the amount of charge stored on capacitors CMP and CMN. However, processing circuit 210 may calculate the amount of charge on capacitors CMP and CMN or the increase in the amount of charge on capacitors CMP and CMN if it is needed or desirable for determining new values for target voltages VMPT and VMNT.

Process decrease 924 performs the inverse process of process increase 922. In process decrease 924, handle 200 decreases the amount of charge stored on capacitors CMP and CMN prior to providing a pulse. As discuss above, processing circuit 210 may use stored information to adjust target voltages VMPT and VMNT downward so that the next pulse of the stimulus signal provides less charge that is possibly closer to the predetermined amount of charge. Processing circuit may perform the same types of operations as discussed with respect to process increase 922, but in a way to decrease the amount of charge delivered by the next pulse of the stimulus signal.

Processes 904-918 and 922-926 are repeated until process compare 918 determines that the amount of charge delivered by the pulse of the stimulus signal is about the same as the predetermined (e.g., target) amount of charge. Once handle 200 has adjusted (e.g., set) its operation so that the predetermined amount of charge is delivered, execution moves to process record 920.

In process record 920, processing circuit 210 records (e.g., stores) the value of voltage VMH, measured across measurement capacitor CMH in the most recent execution of process measure 914. This measured value of VMH is referred to as the golden voltage of handle 200 (e.g., golden voltage, Vgolden) because it is the voltage across measurement capacitor CMH just after delivery of a pulse of the stimulus signal that provided the predetermine amount of current or an amount close thereto. In the environment in which the calibration is being conducted (e.g., calibration environment), each time the voltage across measurement capacitor CMH is the golden voltage, or close thereto, the amount of charge delivered by the pulse of the stimulus signal was the predetermined amount of charge or close thereto. In other words, handle 200 now has the information that it needs to adjust its circuits to provide the predetermined amount of charge for the environment in which it is presently operating (e.g., operating environment).

Process record 920 may also record voltages VMPT and VMNT. Voltages VMPT and VMNT may be recalled from memory and capacitors CMP and CMN charged to VMPT and VMNT respectively.

If handle 200 were to remain in the environment prevalent during calibration (e.g., cooperating with tester 300), each time handle 200 measured Vgolden across measurement capacitor CMH, it would know that the pulse that was just delivered provided the predetermined amount of charge. However, handle 200 will be used in environmental conditions that differ from the calibration environment. Further, the components of handle 200 change with time thereby changing the voltage measured across measurement capacitor CMH over time. In different environmental conditions, for example a different temperature, measuring Vgolden across measurement capacitor CMH may not mean that the predetermined amount of charge was delivered by the pulse because the capacitance of measurement capacitor CMH changes with temperature. As environmental conditions change or the age of the components, the voltage across measurement capacitor CMH will change when the predetermined amount of charge is delivered.

Equation no. 1 below highlights the issue of the change in environmental conditions. In equation no. 1 below, the amount of charge Q is equal to the capacitance of measurement capacitor CMH multiplied by the voltage measured across measurement capacitor CMH.

$$Q=C*V \qquad \text{Equation no. 1}$$

It is desirable to determine the voltage across measurement capacitor CMH in different environmental conditions while measurement capacitor CMH holds the predetermined amount of charge so that in different environmental conditions handle 200 may determine whether a pulse provided the predetermined amount of charge.

Fortunately, the amount of charge provided to a capacitor may be determined in another way that is independent of capacitance. In equation no. 2 below, the amount of charge Q is equal to the magnitude of the current multiplied by the duration of time of the current.

$$Q=I*t \qquad \text{Equation no. 2}$$

Processing circuit 210 of handle 200 may include a current source and a timer. A current source may provide current such that the charge provided per unit time is fairly constant regardless of the environment in which the current source operates. A current source that provides charge per time that varies little over temperature and/or operating voltage may be referred to as a constant current source or a temperature insensitive (e.g., independent) current source. In an implementation, the current provided by a current source over the operating temperature and voltage of the current source may vary plus or minus three percent (3%). Providing a current that varies plus or minus three percent over a range of temperature and/or voltage may be considered to be substantially constant.

A timer may measure an elapse of time. A time may start counting, count for a duration of time, then stop counting. The count of the timer represents the time that elapsed while the timer was counting. The length of the elapse of time is the duration of the elapse or the duration of time during which the counter was counting. A duration of time is a period of time.

The variation of the current source and the operation of the timer over temperature may be fairly minimal, so that processing circuit may charge a capacitance with the predetermined amount of charge in any environmental conditions. Once a capacitance, in particular measurement capacitor CMH has been charged with the predetermined amount of charge, the voltage across measurement capacitor CMH represents the target voltage for providing the predetermined amount of charge in a pulse.

To determine the target voltage across measurement capacitor CMH to provide the predetermined amount of charge in any environmental condition, handle 200, while it is in the environmental conditions of tester 300, uses its current source to convert Vgolden to a golden time (Tgolden). If a known amount of current is provided for a Tgolden amount of time, the amount of charge provided is the predetermined amount of charge regardless of environmental conditions.

To determine Tgolden, processing circuit 210 uses its current source to charge measurement capacitor CMH to Vgolden while measuring the charging time, which is Tgolden, using a timer. Since Vgolden represents a predetermined amount of charge while handle 200 is in the calibration environment, Tgolden represents the amount of time it takes to put the predetermined amount of charge on measurement capacitor CMH using the current source. Because the amount of current provided by the current source changes little over temperature and the accuracy of the timer also changes little over temperature, Tgolden represents the amount of time it takes for the current source to charge measurement capacitor CMH with the predetermined amount of charge over all environmental conditions.

While handle 200 is still in the calibration environment (e.g., proximate to tester 300) handle 200 may perform additional processes (e.g., 928-938) to determine Tgolden so that voltage across measurement capacitor CMH when it holds the predetermined amount of charge in all environmental conditions may be determined.

In process discharge 928, handle 200 initializes the voltage across measurement capacitor CMH to a known value by shorting measurement capacitor CMH to ground. Shorting measurement capacitor CMH to ground removes all charge from measurement capacitor CMH. Process discharge 928 performs the same operations and achieves the same result as process discharge 908 904. Execution proceeds to process start time 930.

In process start time 930, handle 200 initializes a timer and prepares the timer to measure a period of time. For example, processing circuit 210 includes a microprocessor that initializes one of its timers to zero and instructs the timer to start counting up. The count of the timer increments in accordance with a clock (e.g., crystal, oscillator). With many crystals, the frequency of the crystal varies little (e.g., 0.50 ppm) over the temperature range of operation of the crystal, so that a period of time counted by a timer varies little over temperature. Execution proceeds to process charge 932.

In charge 932, a current source of processing circuit 210 provides a current to charge measurement capacitor CMH while processing circuit 210 monitoring the voltage across VMH. The timer initialized above starts counting at about the same time that the current source starts providing its current to measurement capacitor CMH. When processing circuit 210 detects that the voltage across measurement capacitor CMH is equal to Vgolden control moves to process end time 934.

In process end time 934 and process set 936, processing circuit 210 stops the count of the timer started in process start time 930 and records the value of the timer in nonvolatile memory as the golden time of handle 200 (Tgolden). The golden time represents the duration of time that the current source provides a current to charge measurement capacitor CMH to the golden voltage. Storing Tgolden allows the processing circuit 210 to later to calibrate the stimulus signal by determining the voltage across measurement capacitor CMH that represents providing the predetermined amount of charge or close thereto for the operating environmental conditions. Storing Tgolden for later retrieval permits a handle to calibrate the amount of charge provided by a pulse of the current in the calibration environment and in any other environmental condition wherever the handle is operating. Storing Tgolden enables a handle to calibrate the stimulus signal in environments that differ from the calibration environment.

In process exit 938, the handle determines calibration is complete and the handle exits the calibration mode.

Handle 200 performs method 1000 self-calibrate while in use in the field in the current environmental conditions. Handle 200 may perform method 1000 each time the handle is activated for use (e.g., armed). Method 1000 includes processes arm 1002, retrieve 1004, discharge 1006, charge 1008, set 1010, end 1012.

In process arm 1002, the user of the CEW manipulates (e.g., switches, moves) the safety switch on the CEW to the armed position. Arming handle 200 causes processing circuit 210 to perform method 1000 to self-calibration handle 200. Processing moves to process retrieve 1004.

In process retrieve 1004, the processing circuit 210 retrieves from nonvolatile memory Tgolden. Processing moves to process discharge 1006.

In process discharge 1006, handle 200 initializes the voltage across measurement capacitor CMH to a known value by shorting measurement capacitor CMH to ground. Shorting measurement capacitor CMH to ground removes all charge from measurement capacitor CMH. Process discharge 1006 performs the same operations and achieves the same result as process discharge 904. Execution proceeds to process charge 1008.

In process charge 1008, the processing circuit 210 uses a current source to charge measurement capacitor (CMH) for the duration of time specified by Tgolden as counted by a timer of processing circuit 210. Processing circuit 210 starts the timer and providing the current at about the same time. Providing the constant current to measurement capacitor CMH for the duration Tgolden charges measurement capacitor CMH with the predetermined amount of charge. The voltage across measurement capacitor CMH after being charged with the predetermined amount of charge is the voltage that will be on measurement capacitor CMH each time a pulse provides the predetermined amount of charge for the current environmental conditions. This voltage is referred to as the operational target voltage. Processing moves to process set 1010.

In process set 1010, processing circuit 210 measures the voltage across measurement capacitor CMH and stores the value as the operational target voltage. Processing circuit 210 compares the voltage across measurement capacitor CMH after delivery of each pulse and compares the voltage to the operational target voltage to determine whether the pulse delivered the predetermined amount of charge. Processing circuit 210 uses the result of the comparison to adjust its operation so that the charge delivered by each pulse is as about the same as the predetermined amount of charge as possible. The processes performed to adjust operation of handle 200 is discussed below with respect to method 1100.

In process end 1012, the processing circuit 210 finishes its self-recalibration.

After handle 200 has completed self-calibration method 1000, handle 200 may deliver a stimulus signal. A stimulus signal includes a series of current pulses. Handle 200 performs method 1100, each time the trigger is pulled, to attempt to deliver the predetermined amount of charge with each pulse of the stimulus signal.

Method 1100 includes processes pull trigger 1102, discharge 1104, charge 1106, remove 1108, pulse 1110, measure 1112, decision 1114, compare 1116, increase 1118, decrease 1120, compare 1122, and end 1124.

In process pull trigger 1102, the user of the CEW has pulled the trigger to launch the electrodes from a deployment unit (e.g., cartridge) toward a target to deliver the stimulus signal through the target. The CEW prepares itself to provide the pulses of the stimulus signal. For example, processing circuit 210 may detect the pull of trigger 274. Processing circuit 210 may perform the processes of method 1100, in whole or part, or control other components, such as stimulus generator 234, launch generator 232, and detector 236 to perform method 1100. Execution moves to process discharge 1104.

In process discharge 1104, the handle initializes measurement capacitor CMH to measure the amount of charge provided by a pulse of the current. Measurement capacitor CMH is initialized by removing the charge stored on measurement capacitor CMH (e.g., initializing to zero). For example, processing circuit 210 closes switch S728 to discharge measurement capacitor CMH. Discharging measurement capacitor CMH removes the charge stored on measurement capacitor CMH from a previous pulse and prepares measurement capacitor CMH to store the charge from a next pulse of the stimulus signal. Processing circuit 210 discharges measurement capacitor CMH by closing switch S728 ground capacitor CMH to remove all charge stored on measurement capacitor CMH. Execution moves to process charge 1106.

In process charge 1106, the CEW charges stimulus capacitors CMP and CMN to a target voltage VMPT and VMNT respectively in preparation of providing a pulse charge through a target. The amount of charge stored on CMP and CMN may be adjusted for each pulse to deliver the predetermined amount of charge to the target. The initial values of VMPT and VMNT may be set by estimating the target voltages based on stored data, by using empirical data to determine initial values, or by using default values stored by handle 200. Execution moves to process remove 1108.

In process remove 1108, the handle removes (e.g., opens) the short across measurement capacitor CMH. Removing the short across CMH is timed to happen just before a pulse of the stimulus signal is provided by stimulus generator 234 to selected cartridge. Measurement capacitor CMH is initialized so that it may collect the charge provided by the next pulse of the current. For example, processing circuit 210 opens switch S728 to allow measurement capacitor CMH to collect charge from a pulse of the stimulus signal that is about to be delivered by capacitors CMP and CMN in process pulse 1110. Execution moves to process pulse 1110.

In process pulse 1110, handle 200 provides a current pulse to the electrodes that have been selected to provide the pulse of the stimulus signal. For example, the processing circuit 210 selects signal P1 and signal N1 of bay 240 to provide the pulse of the stimulus signal to electrodes P1 and N1. Processing circuit 210 closes switch S720 and S724 which causes a release of current from ionization capacitor CI into the primary windings of transformers T710 and T714. A high voltage is induced onto the secondary windings of transformers T710 and T714. The high voltage of the transformers creates an ionization path between the electrodes P1 and electrode N1 to the target. Once the ionization path is established, the charge from stimulus capacitors CMP and CMN discharges through the target via the ionization path. The discharge of charge from CI, CMP, CMN through the selected electrodes creates current pulse 1110. After delivery of the current pulse, execution moves to process measure 1112.

After handle 200 provides the pulse of the stimulus signal, process measure 1112 measures the voltage VMH on measurement capacitor CMH at terminal 802. For example, processing circuit 210 measures the voltage across measurement capacitor CMH. The voltage VMH represents the amount of charge delivered by the pulse of the stimulus signal provided in process pulse 1110 for the present environmental conditions. Execution moves to process decision 1114.

In process decision 1114, processing circuit 210 determines whether all of the stimulus pulses of the stimulus signal have been provided. The CEW sends out a predetermined number of current pulses for each stimulus signal. Processing circuit tracks the number of pulse that should be sent in a series and the number of pulses that have been sent, so it can determine whether all of the pulses of a series have been sent. If all of the pulses of a stimulus signal have been provided, execution moves to process end 1124. If all of the pulses of the stimulus signal have not been provided, execution moves to compare 1116

The pulse provided in process 1116 charges capacitor CMH to voltage VMH. After the pulse has been delivered, process compare 1116 compares voltage VMH to the operational target voltage that was determined method 1000. The operational target voltage, as discussed above, represents the predetermined amount of charge or an amount close thereto for the present environmental conditions. As discussed above, providing the predetermined amount of charge or about the same as a predetermined amount of charge for each pulse may improve the effectiveness of the stimulus signal. If the amount of charge delivered by the pulse is the same or about the same as the predetermined amount of charge, execution moves to process discharge 1104.

If the amount of charge delivered by the pulse provided in process pulse 1110 is not the same or about the same as the predetermined amount of charge, execution moves to process compare 1122 and subsequent processes 1118 and 1120 to adjust the charge delivered by a next pulse of the stimulus signal so that the next pulse provides an amount of charge that is closer to the predetermined amount of charge.

In process compare 1122, the voltage VMH across measurement capacitor CMH as created by the pulse provided in process pulse 1110 is compared to the operational target voltage to determine whether the voltage VMH is greater than the operational target voltage. If the voltage VMH is greater than the operational target voltage, handle 200 determines that the previous pulse provided more than the predetermined amount of charge, so the amount of charge provided by the next pulse of the stimulus signal should be decreased. If the voltage VMH is not greater than the operational target voltage, handle 200 determines that the previous pulse provided less than the predetermined amount of charge, so the amount of charge provided by the next pulse of the stimulus signal should be increased. If the amount of charge for the next pulse of the stimulus signal needs to be increased, execution moves to process increase 1118; otherwise, execution moves to process decrease 1120.

Handle 200 adjusts the amount of charge delivered by a next pulse of the current by adjusting the amount of charge stored on capacitors CMP and CMN prior to delivering the next pulse. The amount of charge for the next pulse is adjusted in process increase 1118 and process decrease 1120.

In process increase 1118, handle 200 increases the amount of charge stored on capacitors CMP and CMN so that the next pulse of the stimulus signal provides more charge. The amount of charge stored on capacitors CMP and CMN is increased by charging capacitors CMP and CMN to a higher voltage prior to delivering the pulse. Processing circuit 210 may maintain a record of the voltages to which capacitors CMP and CMN are charged for each pulse provided. Processing circuit 210 may use the record of voltages and the information regarding the amount of charge provided by each pulse to determine target voltages, VMPT and VMNT, to which capacitors CMP and CMN respectively are charged. Execution proceeds to process discharge 1104 where the process of providing the next pulse of the stimulus signal begins.

In process decrease 1120, handle 200 decreases the amount of charge stored on capacitors CMP and CMN so that the next pulse of the stimulus signal provides less charge. The amount of charge stored on capacitors CMP and CMN is decreased by charging capacitors CMP and CMN to a lower voltage prior to delivering the pulse. The record of voltages with respect to capacitors CMP and CMN discussed above may be used to determine target voltages VMPT and VMNT. Execution proceeds to process discharge 1104 where the process of providing the next pulse of the stimulus signal begins.

In process end 1124, the processing circuit 210 end the execution of method 1100.

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'comprises', 'including', 'includes', 'having', and 'has' introduce an open ended statement of component structures and/or functions. In the specification and claims, the words 'a' and 'an' are used as indefinite articles meaning 'one or more'. When a descriptive phrase includes a series of nouns and/or adjectives, each successive word is intended to modify the entire combination of words preceding it. For example, a black dog house is intended to mean a house for a black dog. While for the sake of clarity of description, several specific embodiments of the invention have been described, the scope of the invention is intended to be measured by the claims as set forth below. In the claims, the term "provided" is used to definitively identify an object that not a claimed element of the invention but an object that performs the function of a workpiece that cooperates with the claimed invention. For example, in the claim "an apparatus for aiming a provided barrel, the apparatus comprising: a housing, the barrel positioned in the housing", the barrel is not a claimed element of the apparatus, but an object that cooperates with the "housing" of the "apparatus" by being positioned in the "housing". The invention includes any practical combination of the structures and methods disclosed. While for the sake of clarity of description several specifics embodiments of the invention have been described, the scope of the invention is intended to be measured by the claims as set forth below.

The location indicators "herein", "hereunder", "above", "below", or other word that refer to a location, whether specific or general, in the specification shall be construed to refer to any location in the specification where the location is before or after the location indicator.

What is claimed is:

1. A handle of a conducted electrical weapon ("CEW") that cooperates with a provided tester for calibrating a stimulus signal of the handle, the stimulus signal for impeding locomotion of a human or animal target, the handle comprising:
    a processing circuit;
    a first capacitance;
    a second capacitance; wherein the processing circuit executes a stored program to:
        charge the first capacitance to a target voltage;
        discharge the second capacitance;
        discharge the first capacitance to provide a pulse of the stimulus signal to the tester, provision of the pulse to the tester charges the second capacitance;
        receive a message regarding an amount of charge provided by the pulse, the amount of charge measured by the tester;
        compare the amount of charge to a predetermined amount of charge;
        adjust the target voltage responsive to the comparison;
        repeat charging the first capacitance, discharging the second capacitance, discharging the first capacitance, receiving the message, comparing the amount of charge, and adjusting the target voltage until the amount of charge measured by the tester is about the same as the predetermined amount of charge; and
        record a magnitude of a voltage across the second capacitance as indicia that the amount of the charge provided by the pulse is about the same as the predetermined amount.

2. The handle of claim 1 wherein the magnitude of the voltage across the second capacitance is measured after the processing circuit compares the amount of charge to the predetermined amount of charge and prior to discharging the second capacitance.

3. The handle of claim 1 wherein the amount of charge is about the same as the predetermined amount of charge when the amount of charge is the predetermined amount of charge plus or minus three microcoulombs.

4. The handle of claim 1 wherein the amount of charge is about the same as the predetermined amount of charge when the amount of charge is the predetermined amount of charge plus or minus five percent of the predetermined amount of charge.

5. The handle of claim 1 wherein the amount of charge is related to the target voltage.

6. A handle of a conducted electrical weapon ("CEW") that cooperates with a provided tester for calibrating a stimulus signal of the handle, the stimulus signal for impeding locomotion of a human or animal target, the handle comprising:
    a processing circuit;
    a first capacitance;
    a second capacitance; wherein the processing circuit executes a stored program to:
        charge the first capacitance to a target voltage;
        discharge the second capacitance;
        discharge the first capacitance to provide a pulse of the stimulus signal to the tester, provision of the pulse to the tester charges the second capacitance;
        receive a message regarding an amount of charge provided by the pulse, the amount of charge measured by the tester;

determine that the amount of charge measured by the tester is about the same as a predetermined amount of charge; and record a magnitude of a voltage across the second capacitance as indicia that the amount of the charge provided by the pulse is about equal to the predetermined amount.

7. The handle of claim 6 wherein the amount of charge is about the same as the predetermined amount of charge when the amount of charge is the predetermined amount of charge plus or minus three microcoulombs.

8. The handle of claim 6 wherein the amount of charge is about the same as the predetermined amount of charge when the amount of charge is the predetermined amount of charge plus or minus five percent of the predetermined amount of charge.

9. The handle of claim 6 wherein the amount of charge is related to the target voltage.

10. The handle of claim 6 wherein the processing circuit includes a microprocessor and one or more switches, the microprocessor controls the one or more switches to charge and discharge the first and second capacitances.

11. The handle of claim 6 wherein the processing circuit includes a communication circuit that receives the message.

12. A method performed by a handle of a conducted electrical weapon ("CEW") for calibrating a stimulus signal of the handle, the stimulus signal for impeding locomotion of a human or animal target, the method comprising:
charging a first capacitance to a target voltage;
discharging a second capacitance;
discharging the first capacitance to provide a pulse of the stimulus signal to a tester, providing the pulse charges the second capacitance;
receiving a message from the tester regarding an amount of charge provided by the pulse of current to the tester, the amount of charge measured by the tester;
comparing the amount of charge to a predetermined amount of charge;
adjusting the target voltage responsive to the comparison;
repeating charging the first capacitance, discharging the second capacitance, discharging the first capacitance, receiving the message, comparing the amount of charge, and adjusting the target voltage until the amount of charge measured by the tester is about the same as the predetermined amount of charge; and
recording a magnitude of a voltage across the second capacitance as indicia that the amount of the charge provided by the pulse is about the same as the predetermined amount.

13. The method of claim 12 wherein discharging the second capacitance comprises discharging the second capacitance so that a magnitude of the voltage across the second capacitance is about zero.

14. The method of claim 12 wherein the amount of charge is about the same as the predetermined amount of charge when the amount of charge is the predetermined amount of charge plus or minus three microcoulombs.

15. The method of claim 12 wherein the amount of charge is about the same as the predetermined amount of charge when the amount of charge is the predetermined amount of charge plus or minus five percent of the predetermined amount of charge.

16. The method of claim 12 wherein adjusting comprises:
increasing the target voltage when the amount of charge is less than the predetermined amount of charge; and
decreasing the target voltage when the amount of charge is greater than the predetermined amount of charge.

* * * * *